(12) United States Patent
Mou et al.

(10) Patent No.: US 11,537,184 B2
(45) Date of Patent: Dec. 27, 2022

(54) WEARABLE DISPLAY DEVICE

(71) Applicants: MICROJET TECHNOLOGY CO., LTD., Hsinchu (TW); Tseng Hsiu Ying, New Taipei (TW)

(72) Inventors: Hao-Jan Mou, Hsinchu (TW); Ta-Wei Hsueh, Hsinchu (TW); Yu-Tzu Chen, Hsinchu (TW); Shou-Cheng Cheng, Hsinchu (TW); Chi-Feng Huang, Hsinchu (TW); Yung-Lung Han, Hsinchu (TW); Tsung-I Lin, Hsinchu (TW)

(73) Assignee: MICROJET TECHNOLOGY CO., LTD., Hsinchu (TW)

( * ) Notice: Subject to any disclaimer, the term of this patent is extended or adjusted under 35 U.S.C. 154(b) by 48 days.

(21) Appl. No.: 17/343,881

(22) Filed: Jun. 10, 2021

(65) Prior Publication Data
US 2021/0397010 A1    Dec. 23, 2021

(30) Foreign Application Priority Data
Jun. 19, 2020    (TW) ................................. 109120890

(51) Int. Cl.
*G06F 1/20*    (2006.01)
*G06F 1/16*    (2006.01)
(Continued)

(52) U.S. Cl.
CPC .............. *G06F 1/206* (2013.01); *G06F 1/163* (2013.01); *G06F 1/203* (2013.01); *B81B 7/0093* (2013.01);
(Continued)

(58) Field of Classification Search
CPC .................................................. G02B 27/0127
See application file for complete search history.

(56) References Cited

U.S. PATENT DOCUMENTS

| 2015/0173237 A1* | 6/2015 | Lin | ...................... H05K 9/0026 |
| | | | 361/736 |
| 2018/0210492 A1* | 7/2018 | Chen | ...................... F04B 49/06 |

(Continued)

FOREIGN PATENT DOCUMENTS

| CN | 110146979 A | 8/2019 | |
| CN | 203894474 | * 10/2022 | ............. G02B 27/01 |

(Continued)

*Primary Examiner* — Mukundbhai G Patel
(74) *Attorney, Agent, or Firm* — McClure, Qualey & Rodack, LLP

(57) ABSTRACT

A wearable display device includes a device body, a heat dissipation processing module, and an inflation actuation module. The device body includes a front cover, a side cover, a fillable gas bag, a circuit board, and a microprocessor. The heat dissipation processing module includes a first actuator corresponding to the microprocessor for performing heat exchange for the microprocessor. The inflation actuation module includes a base member, a gas communication channel, a second actuator, and a valve component. When the second actuator and the valve component are driven, the valve component is opened to control gas introduction of the second actuator, and the second actuator is actuated to transmit the gas to the gas communication channel for gas collection, and the second actuator further transmits the gas to the fillable gas bag for inflating the fillable gas bag, so as to allow a user to wear the wearable display device stably.

19 Claims, 21 Drawing Sheets

(51) Int. Cl.
  *G02B 27/01* (2006.01)
  *B81B 7/00* (2006.01)
  *H05K 7/20* (2006.01)
(52) U.S. Cl.
  CPC .... *B81B 2201/036* (2013.01); *G02B 27/0176* (2013.01); *H05K 7/2099* (2013.01)

(56) References Cited

U.S. PATENT DOCUMENTS

| | | |
|---|---|---|
| 2019/0250651 A1 | 8/2019 | Liu et al. |
| 2020/0150597 A1 | 5/2020 | Aghara et al. |

FOREIGN PATENT DOCUMENTS

| | | |
|---|---|---|
| TW | 201144738 A | 12/2011 |
| TW | I605329 B | 11/2017 |

\* cited by examiner

WEARABLE DISPLAY DEVICE

CROSS-REFERENCE TO RELATED APPLICATION

This non-provisional application claims priority under 35 U.S.C. § 119(a) to Patent Application No. 109120890 filed in Taiwan, R.O.C. on Jun. 19, 2020, the entire contents of which are hereby incorporated by reference.

BACKGROUND

Technical Field

The present disclosure relates to a wearable display device. In particular, to a head-wearable device that is capable of performing heat dissipation, gas inflation, and intraocular pressure detection.

Related Art

In recent years, owing to the quick developments of technologies, the specifications, the equipment, and the functions of devices related to virtual reality have been upgraded rapidly. In order to satisfy the needs of these devices, the ability of the processing chip inside a wearable display device is also upgraded. However, it is understood that, the efficiency of the processing chip will be severely affected if the heat generated during the operation of the processing chip cannot be removed quickly. Furthermore, it should be noted that the wearing comfortableness has to be considered since a user may wear and operate the wearable device for a long time. Moreover, after the wearable device is worn and operated by the user for a long time, overuse of the user's eyes which will cause the user to feel dizzy and/or excessive intraocular pressure, thus adversely affecting the health of the user, should be prevented. In view of above, how to provide a wearable display device capable of improving the problems mentioned above is the main issue for this invention.

SUMMARY

One object of the present disclosure is to provide a wearable display device. In the wearable display device according to one or some embodiments of the present disclosure, the heat dissipation processing module construed by the first actuator of the micro pump can perform heat dissipation effectively for the microprocessing chip inside the wearable display device so as to improve the operation efficiency of the microprocessing chip. Hence, the entire device may be miniaturized and can perform the heat dissipation function quietly. Moreover, the second actuator of the micro pump is provided for inflating the fillable gas bag, so that the wearable display device can provide wearing comfortableness even when the wearable display device is worn by the user for a long time. Furthermore, the third actuator of the micro pump and the intraocular pressure detector are provided for detecting the intraocular pressure of the user, so as to provide a notification to prevent the user from feeling dizzy or from having excessive intraocular pressure and cause damages for the user or affect the health for the user.

A general embodiment of the present disclosure provides a wearable display device including a device body, a heat dissipation processing module, and an inflation actuation module. The device body includes a front cover, a side cover, a fillable gas bag, a circuit board, and a microprocessor. The side cover is connected to one side of the front cover. The fillable gas bag is attached to and positioned with one side of the side cover. The circuit board is disposed and positioned on an inner portion of the side cover. The microprocessor is packaged on the circuit board. The heat dissipation processing module includes a first actuator. The first actuator corresponding to the microprocessor is provided for being actuated to transmit gas to the microprocessor so as to perform heat exchange for the microprocessor. The inflation actuation module disposed on the circuit board includes a base member, a gas communication channel, a second actuator, and a valve component. The base member is positioned on the circuit board and is in communication with the gas communication channel. The second actuator is disposed and positioned in the base member. The gas communication channel is in communication with the fillable gas bag. The valve component disposed on the base member is driven to be opened or closed to control gas introduction of the second actuator. When the second actuator and the valve component are driven, the valve component is opened to control the gas introduction of the second actuator, and the second actuator is actuated to transmit the gas to the gas communication channel for gas collection, and the second actuator further transmits the gas to the fillable gas bag for inflating the fillable gas bag, so as to allow a user to wear the wearable display device stably.

BRIEF DESCRIPTION OF THE DRAWINGS

The disclosure will become more fully understood from the detailed description given herein below, for illustration only and thus not limitative of the disclosure, wherein.

DETAILED DESCRIPTION

Figure 1:
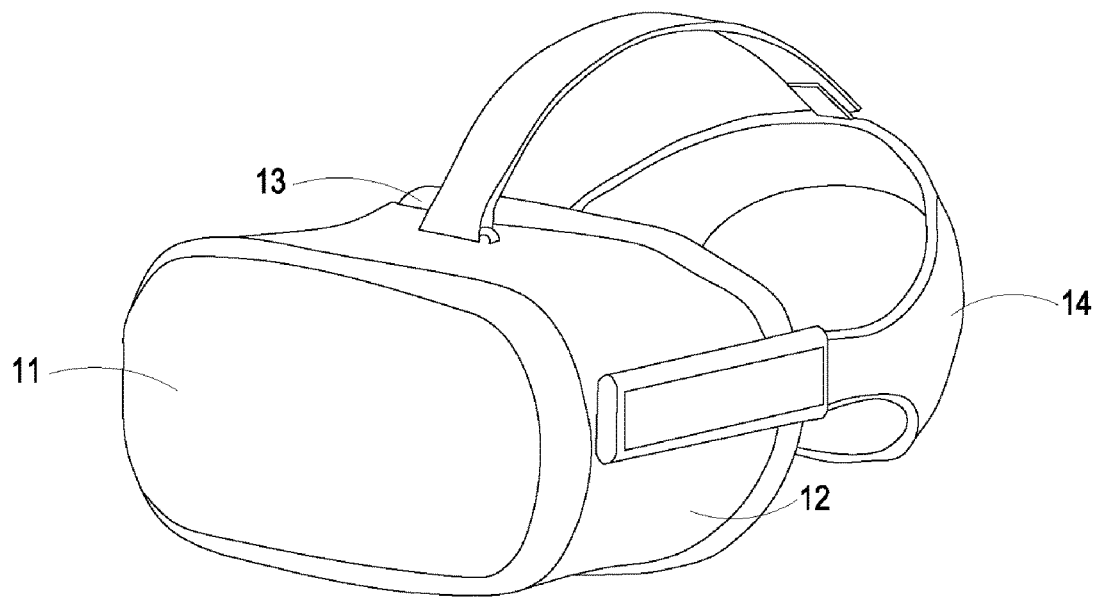
FIG. 1 illustrates a schematic perspective view of a wearable display device according to an exemplary embodiment of the present disclosure.

The present disclosure will now be described more specifically with reference to the following embodiments. It is to be noted that the following descriptions of different embodiments of this disclosure are presented herein for purpose of illustration and description only, and it is not intended to limit the scope of the present disclosure.

Please refer to FIG. 1 to FIG. 4. According to one or some embodiments of the present disclosure, a wearable display device including a device body 1, a heat dissipation module 2, and an inflation actuation module 3 is provided. The device body 1 includes a front cover 11, a side cover 12, a fillable gas bag 13, a head belt 14, a circuit board 15, a microprocessor 16, a communication device 17, and a display assembly 18. The side cover 12 is connected to one side of the front cover 11. The fillable gas bag 13 is attached to and positioned on one side of the side cover 12. The display assembly 18 is disposed and positioned on one side of the side cover 12. The head belt 14 is connected to the side cover 12. The side cover 12 is disposed between the front cover 11 and the fillable gas bag 13. The device body 1 can be worn by a user through the head belt 14. The fillable gas bag 13 is capable of providing positioning function and wearing comfortableness for the wearer. The circuit board 15 is disposed and positioned on an inner portion of the side cover 12. The microprocessor 16 and the communication device 17 are packaged on the circuit board 15. The communication device 17 is provided for performing dual-direction data transmission wirelessly through Bluetooth or Wi-Fi. The microprocessor 16 receives the data from the communication device 17, processes the data, and provides the processed data to the display assembly 18, so as to allow the display assembly 18 to display the image processed by the microprocessor 16. It should be noted that, the display assembly 18 may be two separated displays respectively disposed at the inner portion of the side cover 12, but not limited thereto; the display assembly 18 may also be an integrated display disposed at the inner portion of the side cover 12. It is understood that, the display assembly 18 is electrically connected to the circuit board 15 and the microprocessor 16 so as to display the image processed by the microprocessor 16.

Figure 2A:
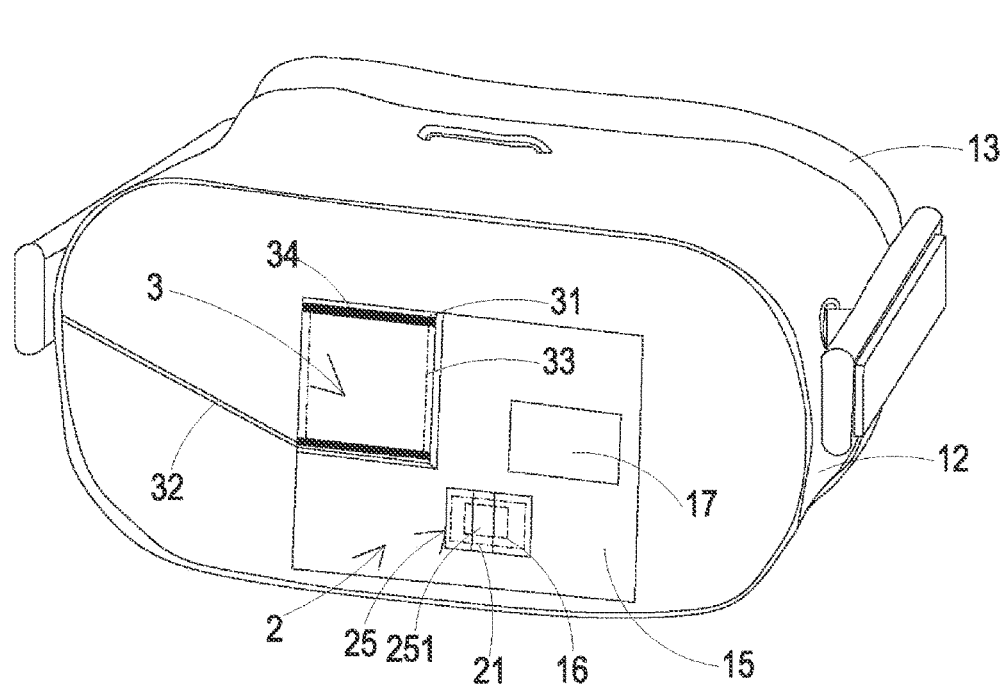
FIG. 2A illustrates a schematic view showing the heat dissipation operation of the microprocessor on the circuit board of the wearable display device according to a preferred exemplary embodiment of the present disclosure.
Figure 5A:
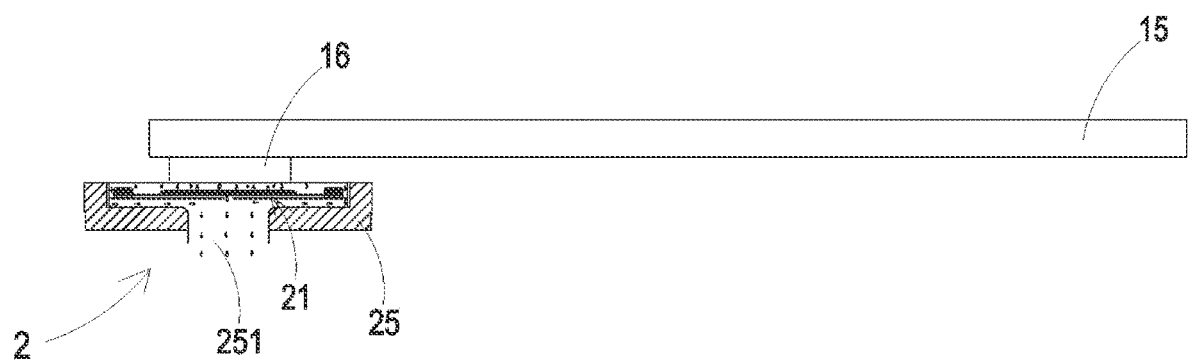
FIG. 5A illustrates a schematic view showing the heat dissipation operation of the heat dissipation processing module corresponding to the microprocessor on the circuit board of the wearable display device according to a preferred exemplary embodiment of the present disclosure.

As shown in FIG. 2A and FIG. 5A, schematic views showing the heat dissipation operation of the heat dissipation processing module 2 corresponding to the microprocessor 16 on the circuit board 15 of the wearable display device according to a preferred exemplary embodiment of the present disclosure are illustrated. The heat dissipation processing module 2 includes a first actuator 21 corresponding to the microprocessor 16, and the first actuator 21 is provided for being actuated to transmit gas to the microprocessor 16 so as to perform heat exchange for the microprocessor 16. Hence, the heat generated by the microprocessor 16 may be effectively dissipated and thus improving the operation efficiency of the microprocessor 16. In this embodiment, the heat dissipation processing module 2 further includes a positioning accommodation base 25. The positioning accommodation base 25 is disposed on the circuit board 16 and has a vent hole 251. The first actuator 21 is disposed and positioned in the positioning accommodation base 25, so that the first actuator 21 is actuated to transmit the gas through the vent hole 251 to perform heat exchange for the microprocessor 16, thus facilitating the cooling procedure of the microprocessor 16. As shown in FIG. 5A, the arrows illustrate the heats generated by the microprocessor 16, and the heats are guided outward through the heat-dissipation processing module 2.

Figure 2B:
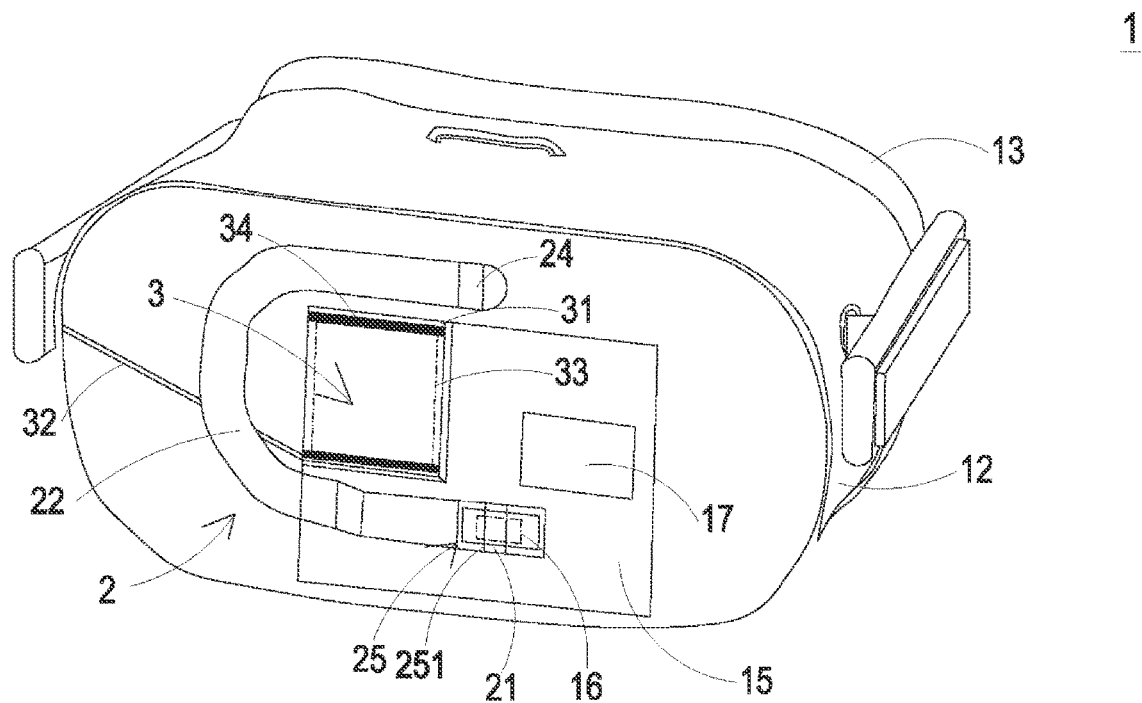
FIG. 2B illustrates a schematic view showing the heat dissipation operation of the microprocessor on the circuit board of the wearable display device according to another preferred exemplary embodiment of the present disclosure.
Figure 5B:
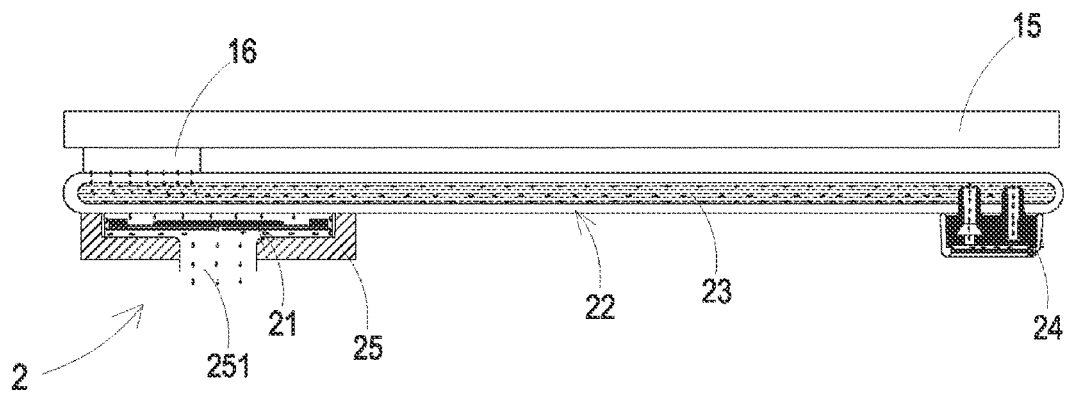
FIG. 5B illustrates a schematic view showing the heat dissipation processing module corresponding to the microprocessor on the circuit board of the wearable display device according to another preferred exemplary embodiment of the present disclosure.
Figure 6:
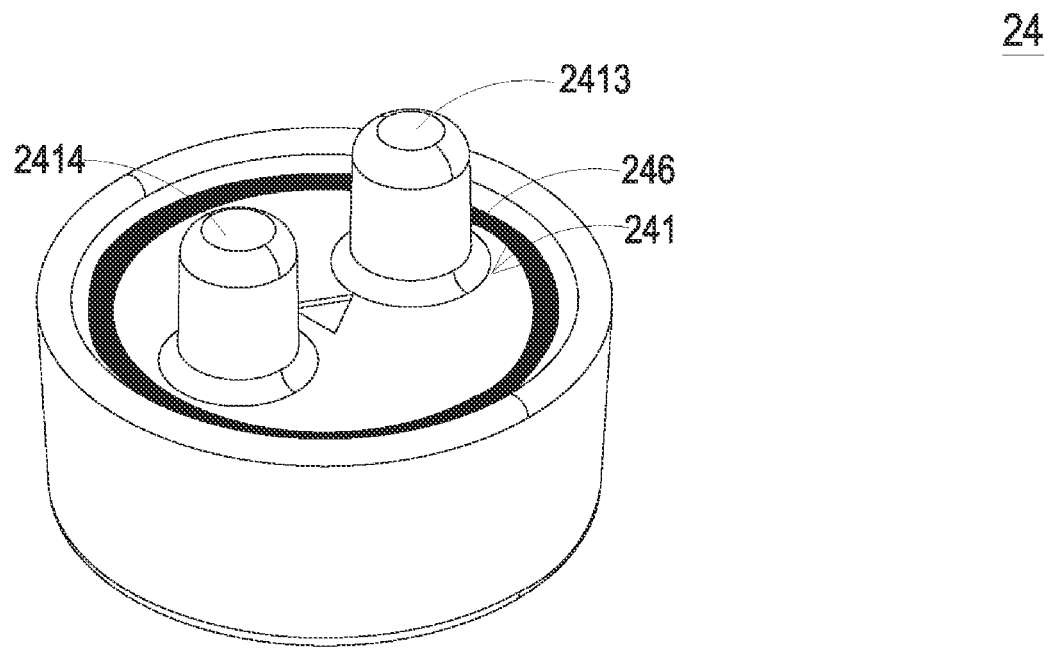
FIG. 6 illustrates a perspective view of the liquid pump of the wearable display device according to an exemplary embodiment of the present disclosure.
Figure 7:
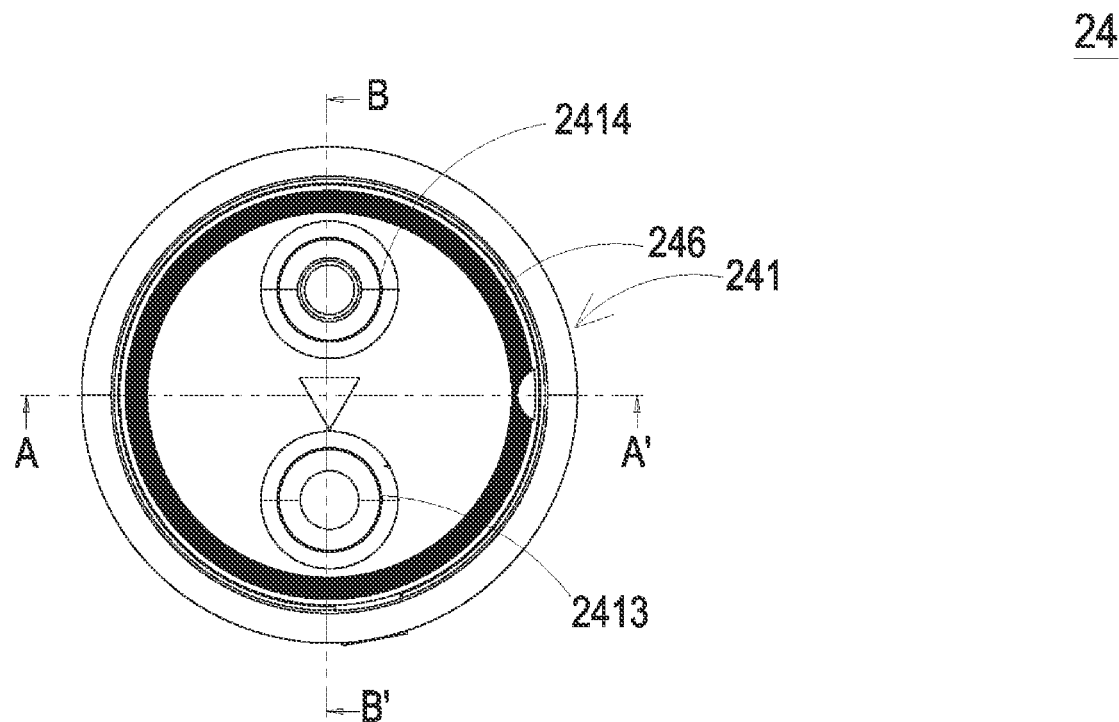
FIG. 7 illustrates a top view of the liquid pump of the wearable display device according to the exemplary embodiment of the present disclosure.
Figure 8A:
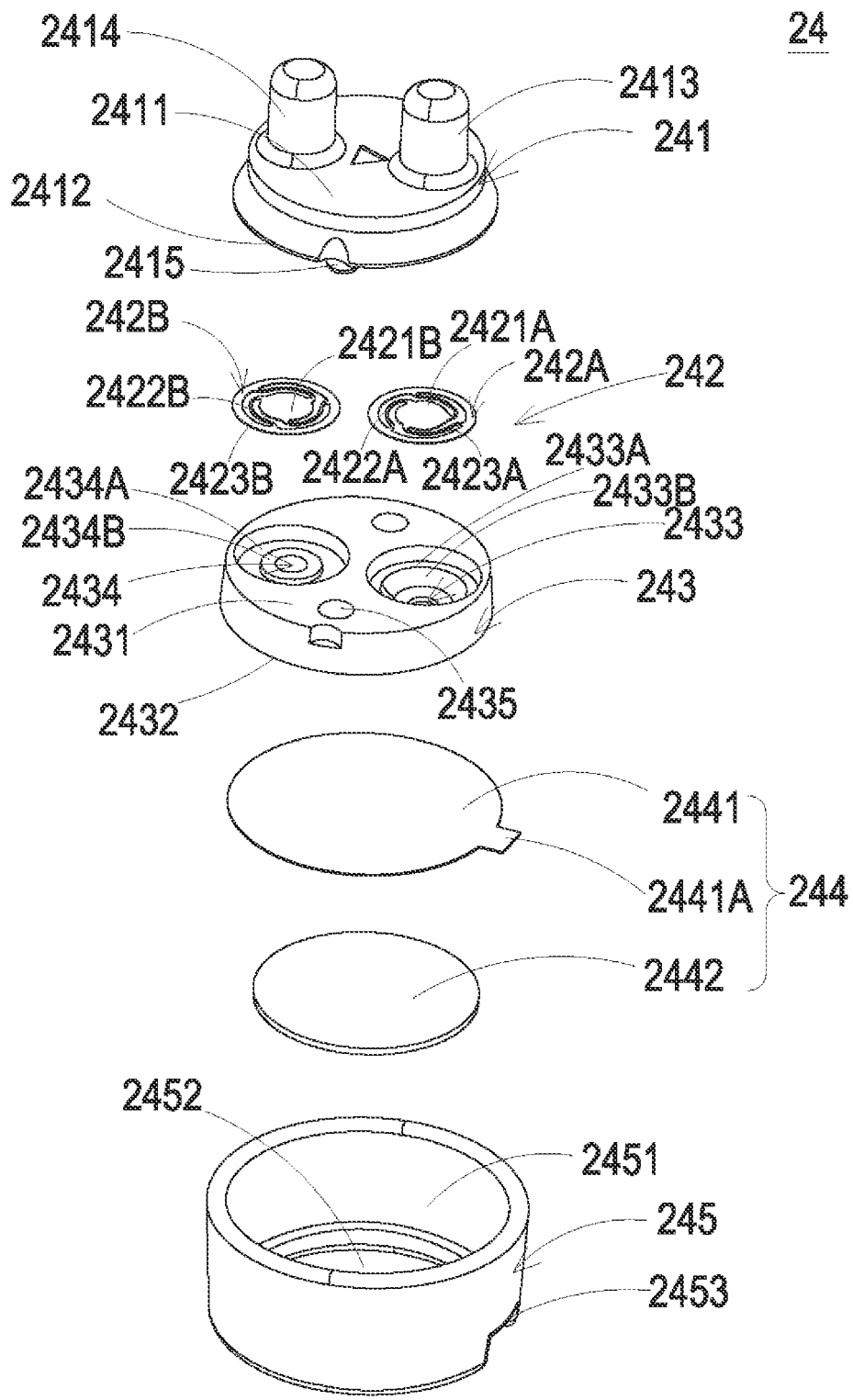
FIG. 8A illustrates an exploded view of the liquid pump of the wearable display device according to the exemplary embodiment of the present disclosure.
Figure 8B:
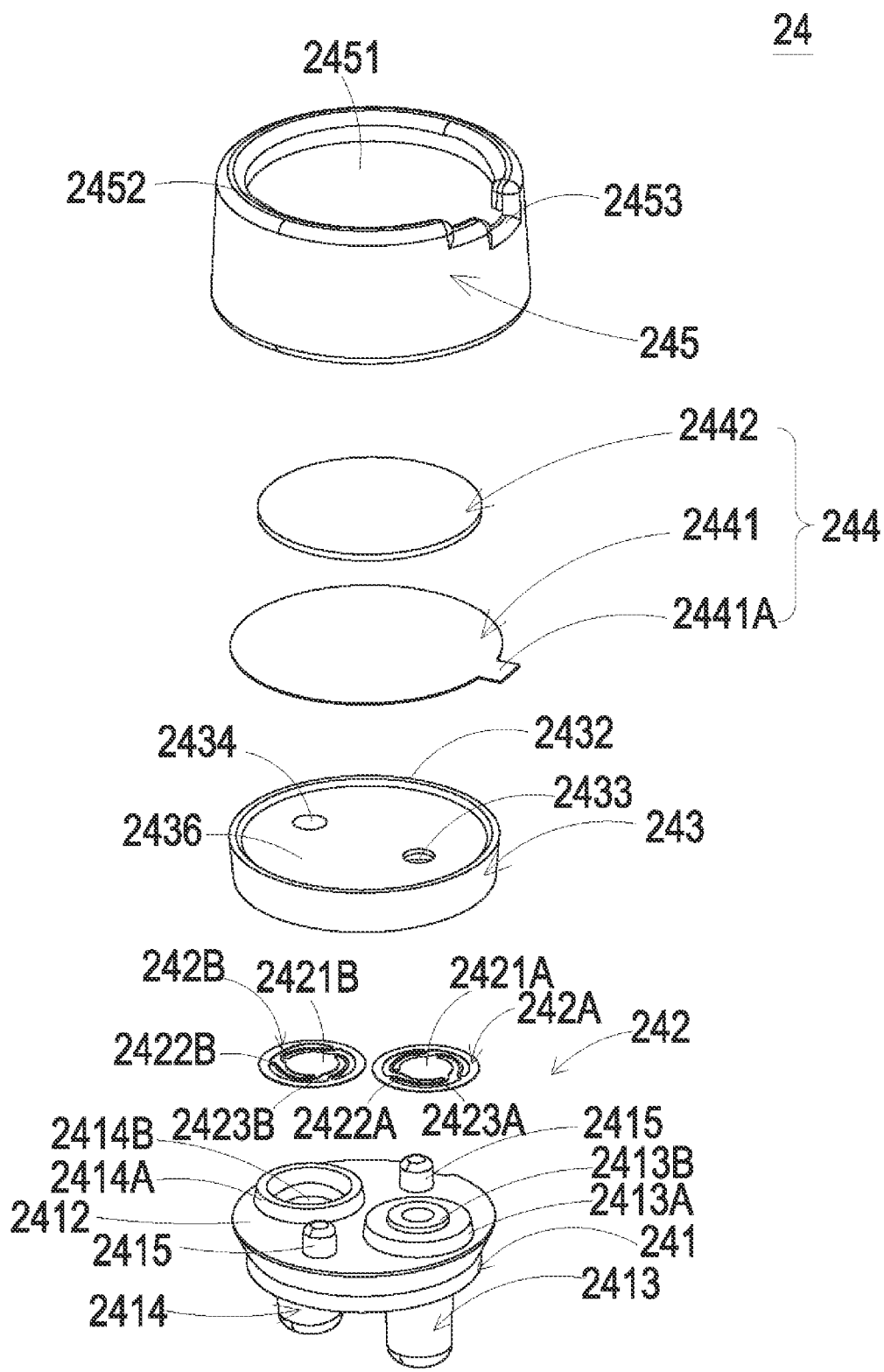
FIG. 8B illustrates an exploded view of the liquid pump of the wearable display device according to the exemplary embodiment of the present disclosure, from another perspective.

As shown in FIG. 2B and FIG. 5B, schematic views showing the heat dissipation operation of the heat dissipation processing module 2 corresponding to the microprocessor 16 on the circuit board 15 of the wearable display device according to another preferred exemplary embodiment of the present disclosure are illustrated. In this embodiment, the heat dissipation processing module 2 includes a first actuator 21, a thermal conductive tube 22, and a positioning accommodation base 25. The thermal conductive tube 22 contacts a heat-generating surface of the microprocessor 16, so as to directly perform heat exchange for the heat generated by the microprocessor 16. A heat dissipation liquid 23 is contained inside the thermal conductive tube 22. The first actuator 21 is disposed and positioned on a surface of the thermal conductive tube 22, so that the first actuator 21 is actuated to transmit the gas to perform heat exchange for the heat dissipation liquid 23 in the thermal conductive tube 22, thereby allowing the thermal conductive tube 22 to accelerate heat exchange for heats generated by the microprocessor 16. In this embodiment, as shown in FIG. 5B, the positioning accommodation base 25 is disposed and positioned on a surface of the thermal conductive tube 22, and the positioning accommodation base 25 has a vent hole 251. The first actuator 21 is disposed and positioned in the positioning accommodation base 25, so that the first actuator 21 is actuated to transmit the gas through the vent hole 251 to perform heat exchange for the thermal conductive pipe 22. As shown in FIG. 5B, the arrows illustrate the heats generated by the microprocessor 16, such that the heats are guided outward through the heat-dissipation processing module 2. In this embodiment, the heat-dissipation processing module 2 may further include a liquid pump 24 in communication with the thermal conductive tube 22, thereby allowing the heat dissipation liquid 23 in the thermal conductive tube 22 to be drawn by the liquid pump 24 and cycled within the thermal conductive tube 22 and thus accelerating heat exchange for the thermal conductive tube 22.

The structure and the operation of the liquid pump is provided as below. As shown in FIG. 6 to FIG. 11B, the liquid pump 24 includes a valve cover 241, two sets of valve sheets 242, a valve base 243, an actuating device 244, and an outer barrel 245. The valve cover 241 has a valve cover first surface 2411, a valve cover second surface 2412, an outlet channel 2414, an inlet channel 2413, and a plurality of latches 2415. The inlet channel 2413 and the outlet channel 2414 respectively penetrate the valve cover 241 from the valve cover first surface 2411 to the valve cover second surface 2412. An inlet convex structure 2413A is formed on the valve cover second surface 2412 surrounding the outer edge of the inlet channel 2413, and a first protruding structure 2413B is disposed on the inlet convex structure 2413A. An outlet convex structure 2414A is formed on the valve cover second surface 2412 and surrounds the outer edge of the outlet channel 2414, and a center portion of the outlet convex structure 2414A is recessed to form an outlet chamber 2414B. The latches 2415 protrude out from the valve cover second surface 2412. The two sets of valve sheets 242 include a first valve sheet 242A and a second valve sheet 242B. The first valve sheet 242A and the second valve sheet 242B have central valve sheets 2421A, 2421B, respectively. A plurality of extending supporting elements 2422A, 2422B is disposed around a periphery of each of the central valve sheets 2421A, 2421B for providing a flexible support. Hollow through holes 2423A, 2423B are formed between each of two adjacent the extending supporting elements 2422A, 2422B, respectively. The valve base 243 is connected to the valve cover 41. The first valve sheet 242A and the second valve sheet 242B are respectively disposed between the valve base 243 and the valve cover 241. The valve base 243 has a valve base first surface 2431, a valve base second surface 2432, an inlet valve channel 2433, and an outlet valve channel 2434. The inlet valve channel 2433 and the outlet valve channel 2434 respectively penetrate the valve base 243 from the valve base first surface 2431 to the valve base second surface 2432. The inlet valve channel 2433 is recessed at an inner edge of the valve base first surface 2431 to form an inlet concave structure 2433A for being connected to the inlet convex structure 2413A of the valve cover 241. The first valve sheet 242A is disposed between the inlet concave structure 2433A and the inlet convex structure 2413A, so that the central valve sheet 2421A presses against the first protruding structure 2413B of the valve cover 241 to close the inlet channel 2413 of the valve cover 241. Moreover, a center portion of the inlet concave structure 2433A is recessed to form an inlet chamber 2433B. The outlet valve channel 2434 is recessed at an inner edge of the valve base first surface 2431 to form an outlet concave structure 2434A, and a second protruding structure 2434B is disposed at a center portion of the outlet concave structure 2434A. The outlet concave structure 2434A is connected to the outlet convex structure 2414A of the valve cover 241, and the second valve sheet 242B is disposed therebetween, so that the central valve sheet 2421B presses against the second protruding structure 2434B so as to close the outlet valve channel 2434 of the cover base 243. Moreover, a plurality of latch grooves 2435 is disposed on the valve base first surface 2431 corresponding to positions of the latches 2415 on the valve cover 241, so that through mating between the latch grooves 2435 and the latches 2415, the valve base 243 is connected to the valve cover 241 to enclose the first valve sheet 242A and the second valve sheet 242B, thereby assembling and positioning the valve base 243 and the valve cover 241 with each other. The valve base second surface 2432 is recessed to form a flow convergence chamber 2436 in communication with the inlet valve channel 2433 and the outlet valve channel 2434. The actuating device 244 includes a vibration sheet 2441 and a piezoelectric element 2442. The piezoelectric element 2442 is attached to one side of the vibration sheet 2441. The vibration sheet 2441 has a conducting pin 2441A, and the vibration sheet 2441 covers the valve base second surface 2432 of the valve base 243 so as to close the flow convergence chamber 2436. One side of the outer barrel 245 has a recessed space 2451. The bottom of the recessed space 2451 has a hollowed central trough 2452 and a penetration opening 2453. The penetration opening 2453 penetrates the side wall of the outer barrel 245 and thus is in communication with outside. The actuating device 244, the valve base 243, the two sets of the valve sheets 242, and the valve cover 241 are sequentially arranged and placed in the recessed space 2451. The conducting pin 2441A of the actuating device 244 is disposed in and penetrates through the penetration opening 2453. A sealing glue 246 is filled into the recessed space 2451 for fixing components in the recessed space 2451. The piezoelectric element 2442 of the actuating device 244 correspondingly arranged in the central trough 2452, and thus the actuating device 244 can vibrate in the central trough 2452 when the actuating device 244 is driven. The inlet channel 2413 of the valve cover 241 corresponds to the inlet chamber 2433B of the valve base 243, and the communication between the inlet channel 2413 of the valve cover 241 and the inlet chamber 2433B of the valve base 243 is controlled by the first valve sheet 242A. The outlet chamber 2414B of the valve cover 241 corresponds to the outlet valve channel 2434 of the valve base 243, and the communication between the outlet chamber 2414B of the valve cover 241 and the outlet valve channel 2434 of the valve base 243 is controlled by the second valve sheet 242B. The central valve sheet 2421A of the first valve sheet 242A constantly presses against the first protruding structure 2413B of the valve cover 241 so as to generate a pre-set force to prevent the liquid from backflow. The central valve sheet 2421B of the second valve sheet 242B constantly presses against the second protruding structure 2434B of the valve base 243 so as to generate a pre-set force to prevent the liquid from backflow. When the piezoelectric element 2442 of the actuating device 244 vibrates and moves downwardly, a suction force is formed in the inlet chamber 2433B of the valve base 243 to pull the central valve sheet 2421A of the first valve sheet 242A away and retain the inlet channel 2413 of the valve cover 241 unclosed. Thus, the liquid is guided to flow into the liquid pump 24 from the inlet channel 2413 of the valve cover 241, flows through the hollow through hole 2423A of the first valve sheet 242A, enters into the inlet chamber 2433B of the valve base 243, and is converged at the flow convergence chamber 2436. When the piezoelectric element 2442 of the actuating device 244 vibrates and moves upwardly, the liquid in the flow convergence chamber 2436 is pushed toward the outlet valve channel 2434 of the valve base 243. Therefore, the central valve sheet 2421B of the second valve sheet 242B is pushed to move away and thus does not contact the second protruding structure 2434B, by which the liquid passes through the hollow through hole 2423B of the second valve sheet 242B, enters into the outlet chamber 2414B of the valve cover 241, and is discharged out of the liquid pump 24 through the outlet channel 2414 to complete the transmission of the liquid.

Please refer to FIG. 6 to FIG. 8B. The liquid pump 24 includes a valve cover 241, two sets of valve sheets 241, a valve base 243, an actuating device 244, and an outer barrel 245. The actuating device 244, the valve base 243, the two sets of valve sheets 242, and the valve cover 241 are sequentially arranged and placed in the outer barrel 245, and a sealing glue 246 is filled to seal the inner space of the outer barrel 245 and fixing components therein.

Please refer to FIG. 6, FIG. 8A, FIG. 8B, and FIG. 10. The valve cover 241 has a valve cover first surface 2411, a valve cover second surface 2412, an inlet channel 2413, an outlet channel 2414, and a plurality of latches 2415. The inlet channel 2413 and the outlet channel 2414 respectively penetrate the valve cover 241 from the valve cover first surface 2411 to the valve cover second surface 2412. An inlet convex structure 2413A is formed on the valve cover second surface 2412 surrounding the outer edge of the inlet channel 2413, and a first protruding structure 2413B is disposed on the inlet convex structure 2413A. An outlet convex structure 2414A is formed on the valve cover second surface 2412 and surrounds the outer edge of the outlet channel 2414, and a center portion of the outlet convex structure 2414A is recessed to form an outlet chamber 2414B. The latches 2415 protrude out from the valve cover second surface 2412. In this embodiment, the number of the latches 2415 is two, but not limited thereto. The number of the latches 2415 may be adjusted according to the actual positioning requirement.

In some embodiments, the major material of the aforementioned two sets of valve sheets 242 is polyimide (PI) polymer material, and the manufacturing method of the valve sheets 242 is the reactive ion etching (RIE) method. The reactive ion etching (RIE) method can be conducted by applying a photosensitive resist to the material where the valve structure is expected to be formed and exposing and developing to form a valve structure pattern of the valve sheets 242, the material is etched by the reactive ion. Since the portion of the polyimide plate covered by the photosensitive resist would not be etched, the desired valve structure of the valve sheets 242 can be etched out. The two sets of valve sheets 242 include a first valve sheet 242A and a second valve sheet 242B. The first valve sheet 242A and the second valve sheet 242B respectively have central valve sheets 2421A, 2421B. A plurality of extending supporting elements 2422A, 2422B is disposed around a periphery of each of the central valve sheets 2421A, 2421B for providing a flexible support. Hollow through holes 2423A, 2423B are formed between each of two adjacent extending supporting elements 2422A, 2422B, respectively.

Figure 9:
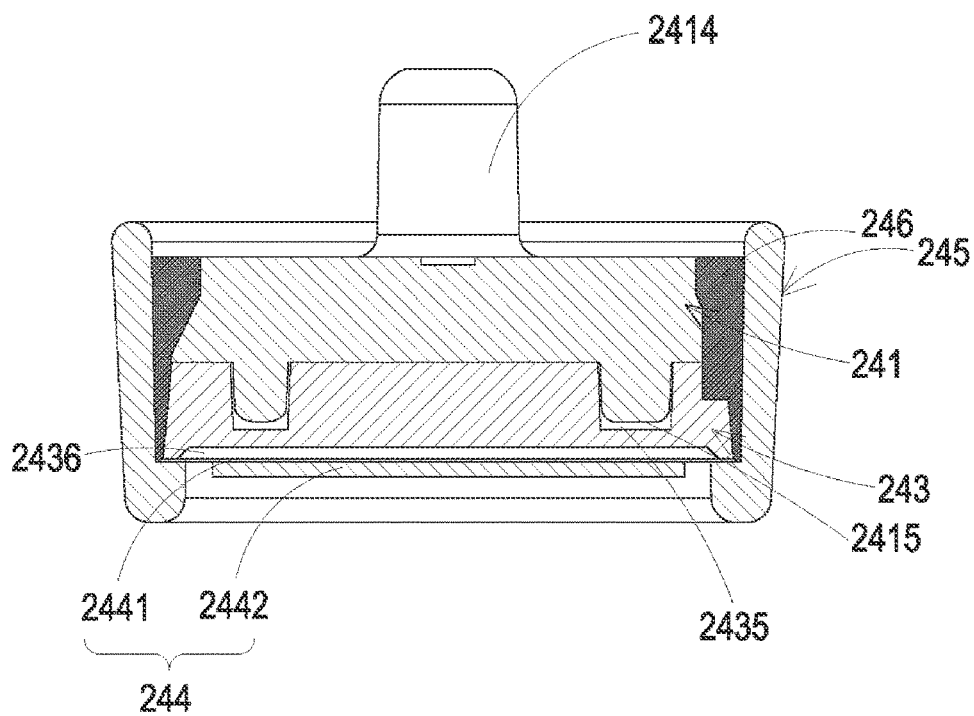
FIG. 9 illustrates a cross-sectional view along line AA' shown in FIG. 7.
Figure 10:
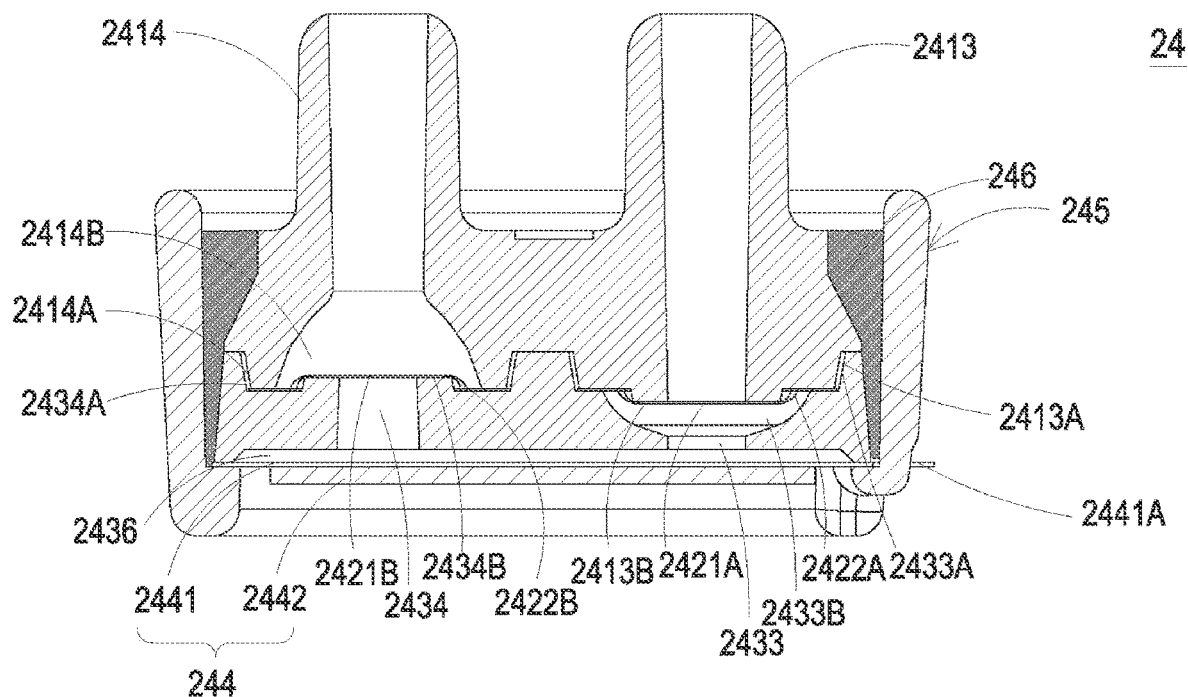
FIG. 10 illustrates a cross-sectional view along line BB' shown in FIG. 7.

The valve base 243 is connected to the valve cover 241. The first valve sheet 242A and the second valve sheet 242B are respectively disposed between the valve base 243 and the valve cover 241. The valve base 243 has a valve base first surface 2431, a valve base second surface 2432, an inlet valve channel 2433, and an outlet valve channel 2434. The inlet valve channel 2433 and the outlet valve channel 2434 respectively penetrate the valve base 243 from the valve base first surface 2431 to the valve base second surface 2432. The inlet valve channel 2433 is recessed at an inner edge of the valve base first surface 2431 to form an inlet concave structure 2433A for being connected to the inlet convex structure 2413A of the valve cover 241. The first valve sheet 242A is disposed between the inlet concave structure 2433A and the inlet convex structure 2413A, so that the central valve sheet 2421A presses against the first protruding structure 2413B of the valve cover 241 to close the inlet channel 2413 of the valve cover 241. The central valve sheet 2421A of the first valve sheet 242A constantly presses against the first protruding structure 2413B so as to generate a pre-set force (as shown in FIG. 10) to facilitate the central valve sheet 2421A to be tightened up on the first protruding structure 2413B and thus prevents the liquid from backflow. Moreover, a center portion of the inlet concave structure 2433A is recessed to form an inlet chamber 2433B. The outlet valve channel 2434 is recessed at an inner edge of the valve base first surface 2431 to form an outlet concave structure 2434A, and a second protruding structure 2434B is disposed at a center portion of the outlet concave structure 2434A. The outlet concave structure 2434A is connected to the outlet convex structure 2414A of the valve cover 241. The second valve sheet 242B is disposed between the outlet concave structure 2434A and the outlet convex structure 2414A, so that the central valve sheet 2421B presses against the second protruding structure 2434B so as to close the outlet valve channel 2434 of the cover base 243. The central valve sheet 2421B of the second valve sheet 242B constantly presses against the second protruding structure 2434B so as to generate a pre-set force (as shown in FIG. 10) to facilitate the central valve sheet 2421B to be tightened up on the second protruding structure 2434B and thus prevents the liquid from backflow. Moreover, a plurality of latch grooves 2435 is disposed on the valve base first surface 2431 corresponding to positions of the latches 2415 on the valve cover 241, and the number of the latch grooves 2435 is the same as that of the latches 2415. Accordingly, as shown in FIG. 9, the latches 2415 of the valve cover 241 are inserted into corresponding latch grooves 2435 of the valve base 243, so that the valve base 243 is connected to the valve cover 241 to enclose the first valve sheet 242A and the second valve sheet 242B, thereby assembling and positioning the valve base 243 and the valve cover 241 with each other. In this embodiment, the number of the latches 2415 is two, so the number of the latch grooves 2435 is two as well, but not limited thereto. The number and position may be adjusted according to the actual positioning needs. Furthermore, the valve base second surface 2432 is recessed to form a flow convergence chamber 2436 in communication with the inlet valve channel 2433 and the outlet valve channel 2434.

The actuating device 244 includes a vibration sheet 2441 and a piezoelectric element 2442. The vibration sheet 2441 may be made of metal material. The piezoelectric element 2442 may be made of lead-zirconate-titanate (PZT) type piezoelectric powder with high piezoelectric constant. The piezoelectric element 2442 is attached to one side of the vibration sheet 2441, and the vibration sheet 2441 covers the valve base second surface 2432 of the valve base 243 so as to close the flow convergence chamber 2436. Moreover, the vibration sheet 2441 has a conducting pin 2441A for being electrically connected to an external power source, so that the piezoelectric element 2442 can be driven to deform and vibrate.

One side of the outer barrel 245 has a recessed space 2451. The bottom of the recessed space 2451 has a hollowed central trough 2452 and a penetration opening 2453. The penetration opening 2453 penetrates the side wall of the outer barrel 245 and thus is in communication with outside. The actuating device 244, the valve base 243, the two sets of the valve sheets 242, and the valve cover 241 are sequentially arranged and placed in the recessed space 2451. The conducting pin 2441A of the actuating device 244 is disposed in and penetrates through the penetration opening 2453. The sealing glue 246 is filled into the recessed space 2451 for fixing components in the recessed space 2451. The piezoelectric element 2442 of the actuating device 244 correspondingly arranged in the central trough 2452, and thus the actuating device 244 can vibrate in the central trough 2452 when the actuating device 244 is driven.

Figure 11A:
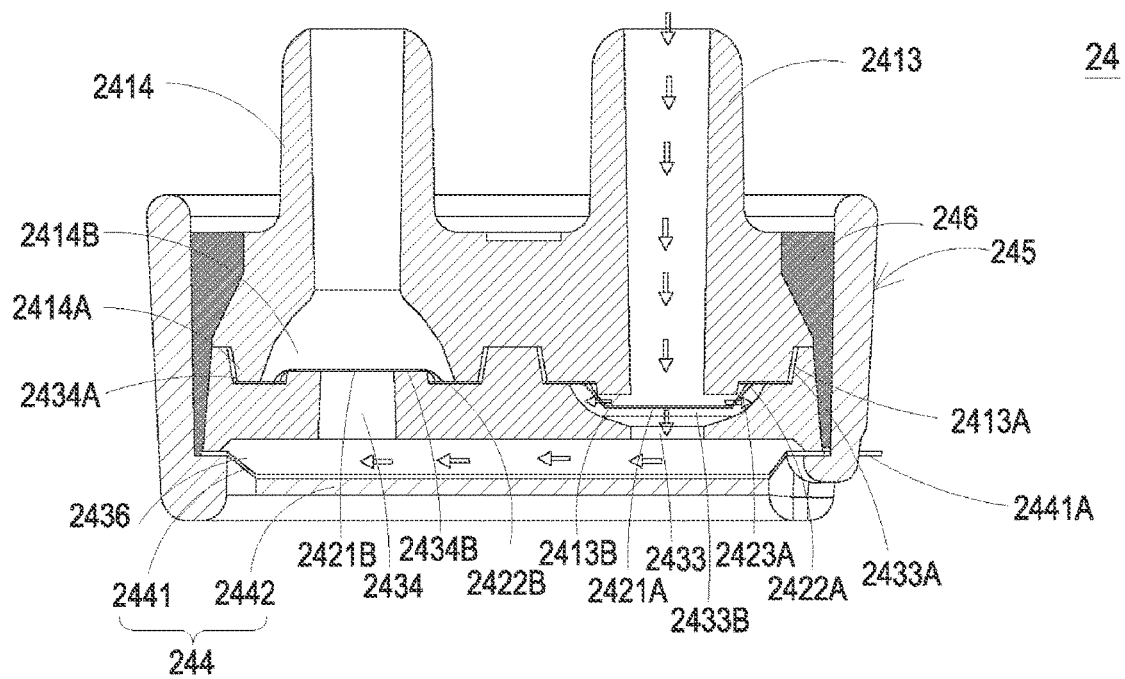
FIG. 11A and FIG. 11B illustrate schematic cross-sectional views showing the liquid pump of the wearable display device at different operation steps.
Figure 11B:
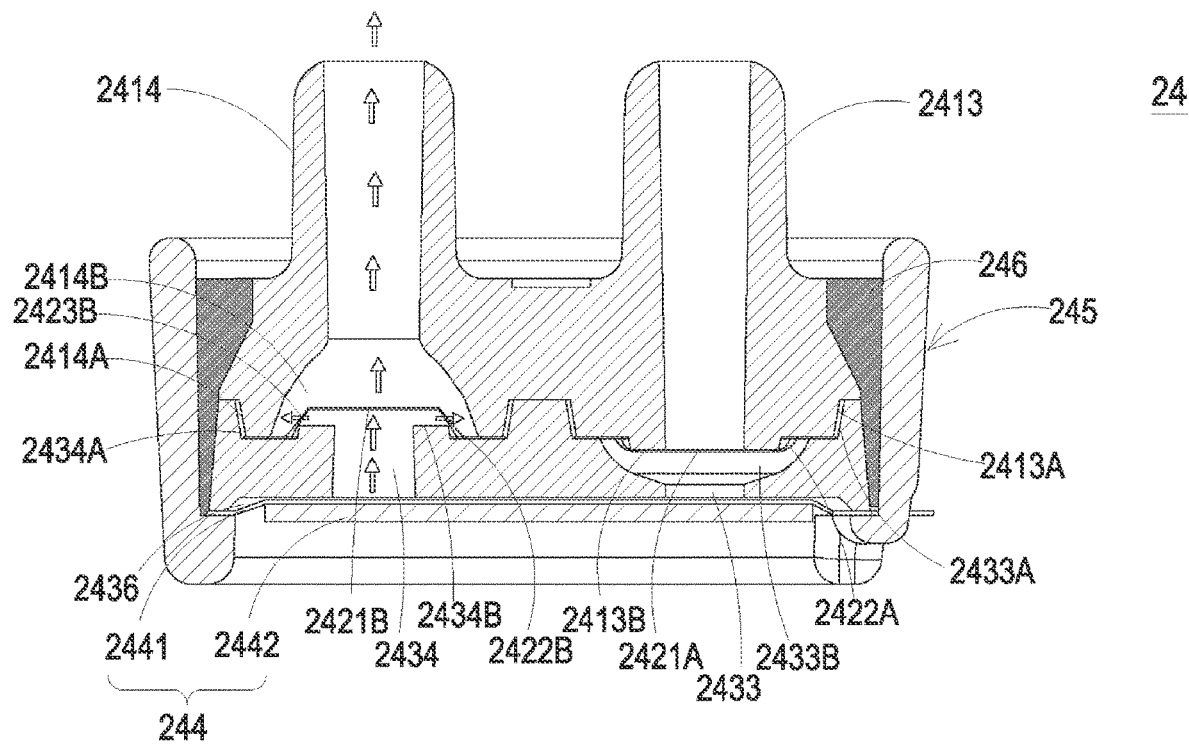

The operation steps for fluid transmission of the liquid pump 24 of the present disclosure is illustrated in FIG. 11A. When the piezoelectric element 2442 vibrates and moves downwardly, a suction force is formed in the inlet chamber 2433B of the valve base 243 to pull the central valve sheet 2421A of the first valve sheet 242A away, so that the central valve sheet 2421A of the first valve sheet 242A does not close the inlet channel 2413 of the valve cover 241. Thus, the liquid is guided to flow into the liquid pump 24 from the inlet channel 2413 of the valve cover 241, flows through the hollow through hole 2423A of the first valve sheet 242A, enters into the inlet chamber 2433B of the valve base 243, and is converged at the flow convergence chamber 2436. Afterwards, as shown in FIG. 11B, when the piezoelectric element 2442 of the actuating device 244 vibrates and moves upwardly, the liquid in the flow convergence chamber 2436 is pushed toward the outlet valve channel 2434 of the valve base 243. Therefore, the central valve sheet 2421B of the second valve sheet 242B is pushed to move away and thus not contact the second protruding structure 2434B, by which the liquid passes through the hollow through hole 2423B of the second valve sheet 242B, enters into the outlet chamber 2414B of the valve cover 241, and is discharged out of the liquid pump 24 through the outlet channel 414 to complete the transmission of the liquid.

Further, as shown in FIG. 2A to FIG. 4, an inflation actuation module 3 is disposed on the circuit board 15. The inflation actuation module 3 includes a base member 31, a gas communication channel 32, a second actuator 33, and a valve component 34. The base member 31 positioned on the circuit board 15 is in communication with the gas communication channel 32. The second actuator 33 is disposed and positioned in the base member 31. The gas communication channel 32 is in communication with the fillable gas bag 13. The valve component 34 is disposed on the base member 31, and the valve component 34 is provided for being opened or closed upon the valve component 34 is driven to control the gas introduction of the second actuator 33. It should be noted that, when the second actuator 33 and the valve component 34 are driven, the valve component 34 is opened to control the gas introduction procedure of the second actuator 33, and the second actuator 33 is actuated to transmit the gas to the gas communication channel 32 for gas collection, and the second actuator 33 further transmits the gas to the fillable gas bag 13 for inflating the fillable gas bag 13, so that a user can wear the wearable display device stably, thus improving the wearing comfortableness for the user.

Figure 16A:
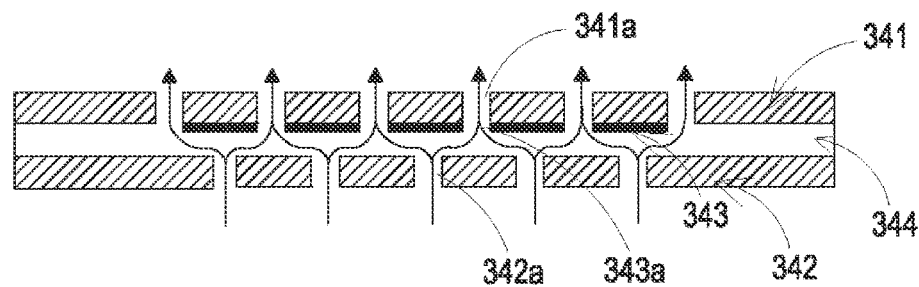
FIG. 16A illustrates a cross-sectional view of the valve component of the wearable display device according to an exemplary embodiment of the present disclosure.
Figure 16B:
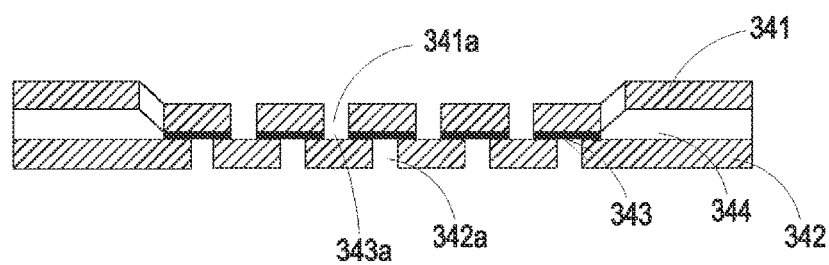
FIG. 16B illustrates a schematic view showing that the valve component of the wearable display device according to the exemplary embodiment of the present disclosure is in a closed state.
Figure 17A:
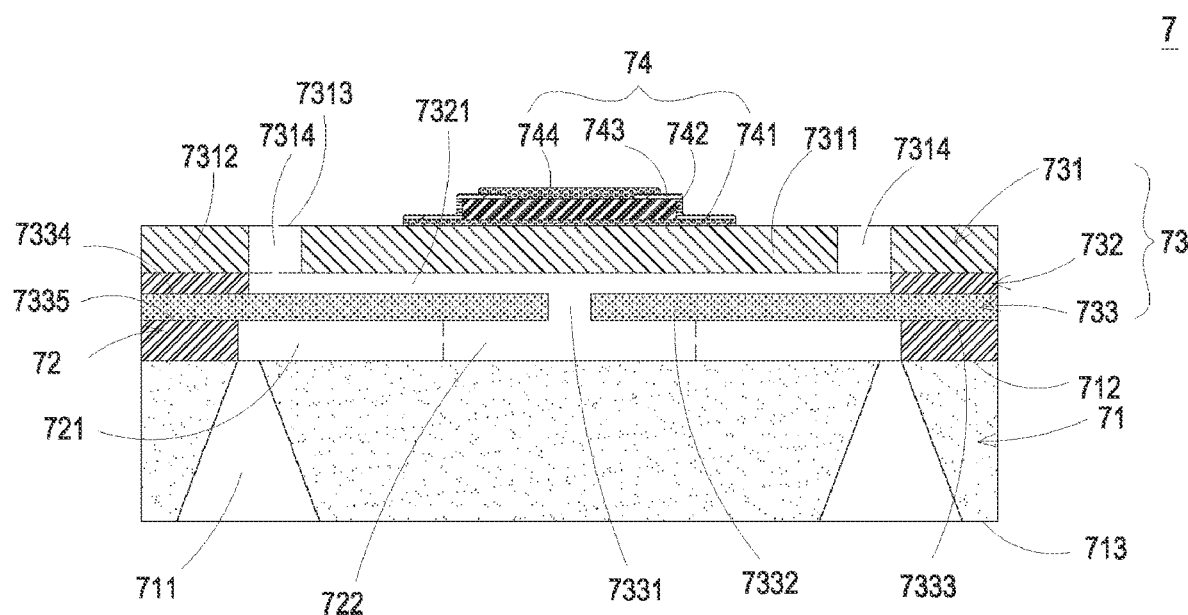
FIG. 17A illustrates a cross-sectional view of the micro-electromechanical systems (MEMS) micro pump of the wearable display device according to an exemplary embodiment of the present disclosure.
Figure 17B:
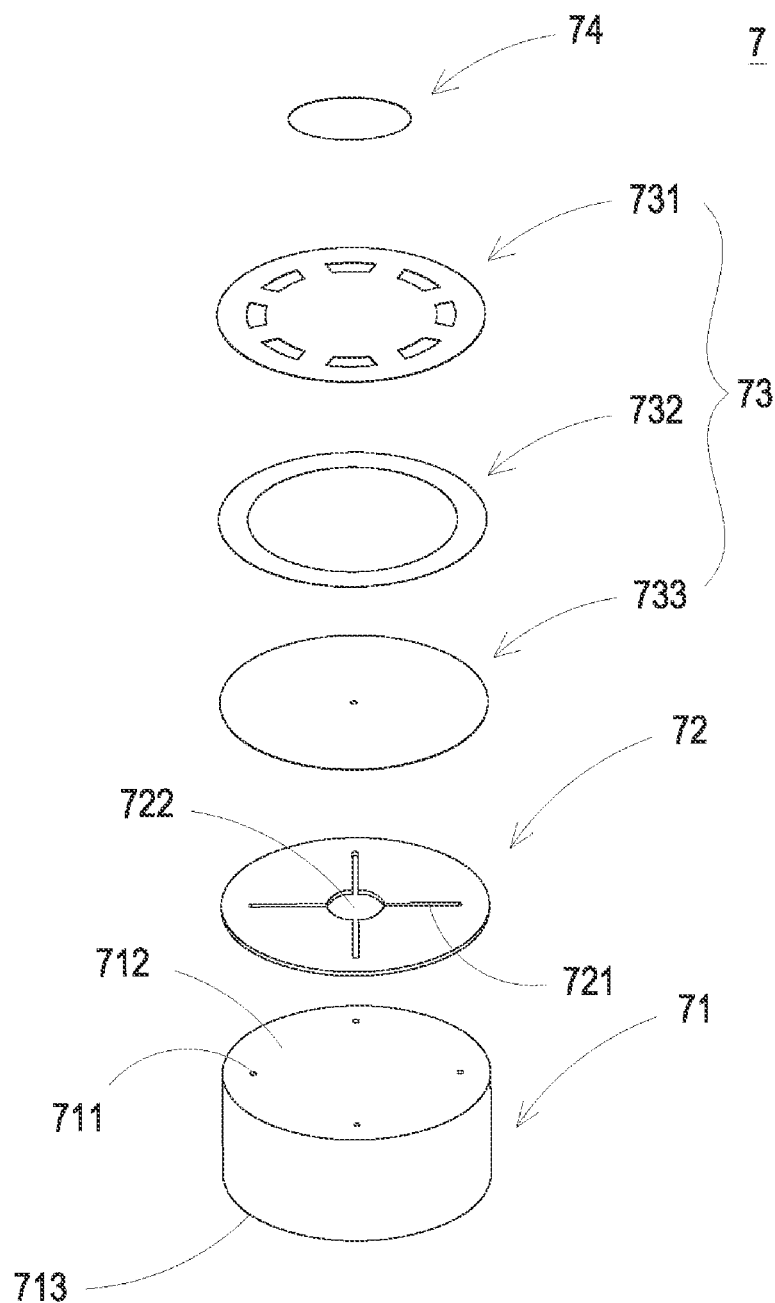
FIG. 17B illustrates an exploded view of the MEMS micro pump of the wearable display device according to the exemplary embodiment of the present disclosure.

The closing and opening of the valve component 34 is described below. As shown in FIG. 16A and FIG. 16B, the valve component 34 includes a valve conductive member 341, a valve base member 342, and a sealing member 343. The valve conductive member 341 is a charged piezoelectric material for electrically connecting to the circuit board 15 and is deformed upon receiving a driving signal from the microprocessor 16. A receiving space 344 is maintained between the valve conductive member 341 and the valve base member 342. The sealing member 343 made of a flexible material is attached to one side of the valve conductive member 341 and is placed in the receiving space 344. A plurality of holes 341a, 342a, 343a is respectively formed on the valve conductive member 341, the valve base member 342, and the sealing member 343. The holes 341a of the valve conductive member 341 are respectively aligned with the holes 343a of the sealing member 343, and the holes 342a of the valve base member 342 do not align with the holes 341a of the valve conductive member 341. Therefore, as shown in FIG. 16A, when the valve conductive member 341 does not receive the driving signal from the microprocessor 16, the valve conductive member 341 is retained in the receiving space 344 and spaced from the valve base member 342, thereby allowing the valve component 34 to stay in an opened state since the holes 342a of the valve base member 342 do not align with the holes 341a of the valve conductive member 341. As shown in FIG. 5B, when the valve conductive member 341 receives the driving signal from the microprocessor 16, the valve conductive member 341 is deformed to move and attach to the valve base member 342, thereby allowing the valve component 34 to stay in a closed state since the holes 343a of the sealing member 343 do not align with the holes 342a of the valve base member 342 and the sealing member 343 covers the holes 342a of the valve base member 342.

Figure 3:
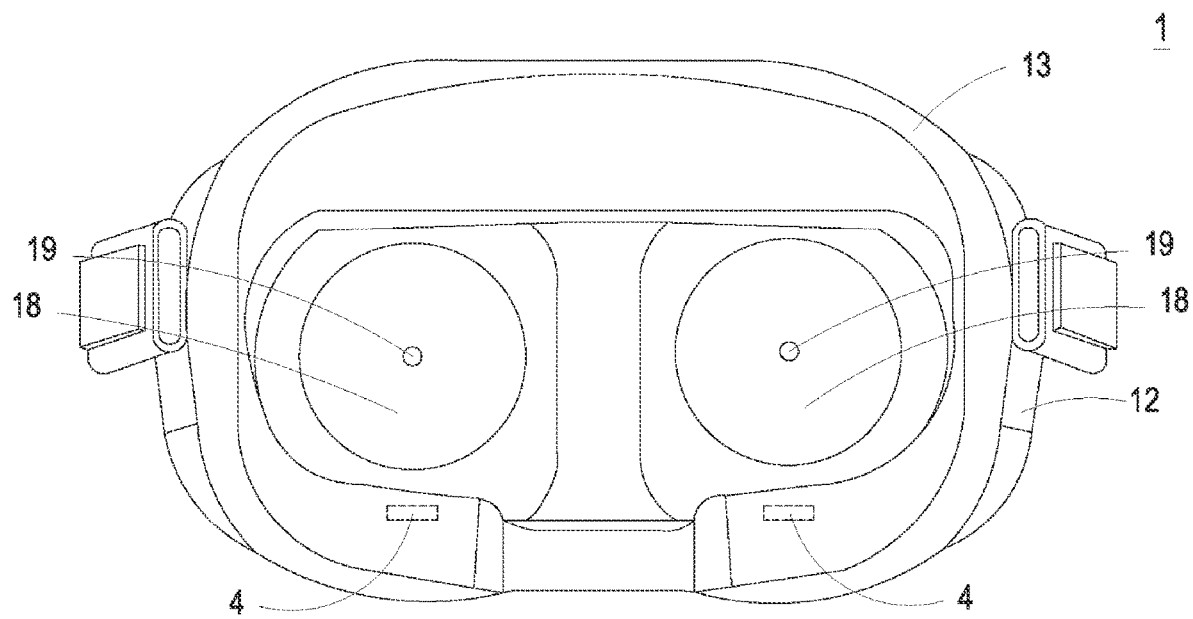
FIG. 3 illustrates a perspective view of the wearable display device according to the exemplary embodiment of the present disclosure, from another perspective.
Figure 4:
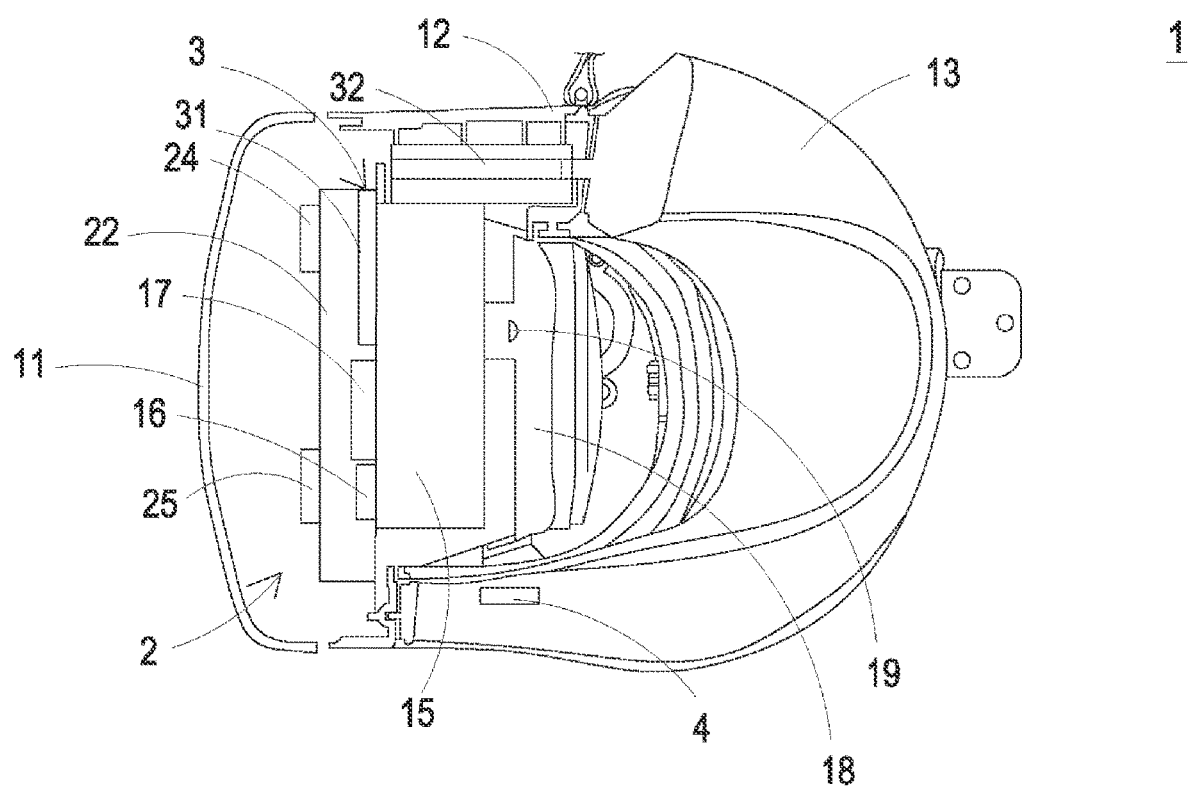
FIG. 4 illustrates a cross-sectional view of the wearable display device according to the exemplary embodiment of the present disclosure.

Please refer to FIG. 3 and FIG. 4. According to one or some embodiments of the present disclosure, the device body 1 further includes an intraocular pressure detection assembly 19 and a set of third actuators 4. The intraocular pressure detection assembly 19 and the set of third actuators 4 together construe an intraocular pressure detection device. Each of intraocular pressure detectors of the intraocular pressure detection assembly 19 is disposed at a center point of a corresponding monitor of the display assembly 18. The intraocular pressure detection assembly 19 is electrically connected to the circuit board 15 and is provided for emitting an infrared light and detecting a light energy of a reflected light of the infrared light. Each of third actuators of the set of third actuators 4 is disposed at a lower portion of the corresponding monitor of the display assembly 18. The set of third actuators 4 is electrically connected to the circuit board 15, and is provided for being actuated to generate a pulse gas. It is understood that, the intraocular pressure detection assembly 19 may be two independent intraocular pressure detectors respectively disposed at the inner portion of the side cover 12, but not limited thereto; the intraocular pressure detection assembly 19 may be a pair of separated intraocular pressure detectors disposed at the inner portion of the side cover 12. Similarly, the set of third actuators 4 may be two independent third actuators respectively disposed at the lower portion of the display assembly 18, but not limited thereto; the set of third actuators 4 may be a pair of separated third actuators disposed at the lower portion of the display assembly 18. After the set of third actuators 4 is driven to generate the pulse gas, the intraocular pressure detection assembly 19 emits the infrared light and calculates the light energy of the reflected light of the infrared light, so that the intraocular pressure detection assembly 19 is capable of detecting an intraocular pressure data of the wearer, thereby allowing the wearable display device to display the intraocular pressure data and provide a notification for the wearer. It should be noted that, regarding the principle of the intraocular pressure detection, pulse air is applied and hit the surface of user's cornea, firstly the hitting force of the pulse air increases as time goes by, so that the user's cornea is flatted or even slightly recessed. During the pulse air hits the user's cornea, the surface of the cornea is forced, so that the cornea is deformed from a protruding state, to a flatted state, and further to a recessed state. Then, as the hitting force of the pulse air decreases, the user's cornea deforms again from the recessed state, to the flatted state, and then is recovered to have the original shape. Within twenty milliseconds as the pulse air hits the user's cornea, the intraocular pressure detection assembly 19 emits the infrared light and detects the light energy of the reflected light of the infrared light so as to estimate the degree of depression of the cornea. The cornea with different curvatures allows the reflected infrared light to have different reflection angles and different light energies. Thereafter, the light energy of the reflected infrared light is calculated to obtain the intraocular pressure of the wearer. Furthermore, it should be noted that, after the microprocessor 16 obtains the intraocular pressure data of the user, the microprocessor 16 may transmit the data to the display assembly 18 to allow the display assembly 18 to show the data. Moreover, if the intraocular pressure data of the user is not in a normal range, the display assembly 18 may provide a warning notification on the monitor. This warning may be implemented by turning off the monitor after a few seconds, so that the wearer is forced to take a rest; alternatively, in another embodiment, this warning may be implemented by reminding the wearer with screen blinking on the monitor or with sounds or voices, so that the wearer can be reminded and prevented from overusing of the user's eyes, which will cause the user to feel dizzy or to have excessive intraocular pressure, and thus adversely affecting the health of the user.

The first actuator 21, the second actuator 33, and each of the third actuators of the set of third actuators 4 may be a micro pump, a blower type micro pump, or a MEMS micro pump. The structure and the operation of the micro pump, the blower type micro pump, and the MEMS micro pump are described in the following paragraphs.

Please refer to FIG. 12A to FIG. 13E, a micro pump is illustrated. The micro pump 5 is sequentially stacked by an inlet plate 51, a resonance sheet 52, a piezoelectric actuator 53, a first insulation sheet 54, a conductive sheet 55, and a second insulation sheet 56. The inlet plate 51 has at least one inlet hole 511, at least one convergence channel 512, and a convergence chamber 513. The inlet hole 511 is used to introduce the gas outside the micro pump 5 to flow into the micro pump 5. The inlet hole 511 correspondingly penetrates the convergence channel 512, and the convergence channel 512 is converged at the convergence chamber 513, so that the gas introduced from the inlet hole 511 can be converged at the convergence chamber 513. In this embodiment, the number of the inlet holes 511 and the number of the convergence channels 512 are the same. Moreover, in this embodiment, the number of the inlet holes 511 and the number of the convergence channels 512 both are four, respectively, but not limited thereto. The four inlet holes 511 respectively penetrate the inlet plate 51 to the four convergence channels 512, and the four convergence channels 512 are converged into the convergence chamber 513.

Figure 12A:
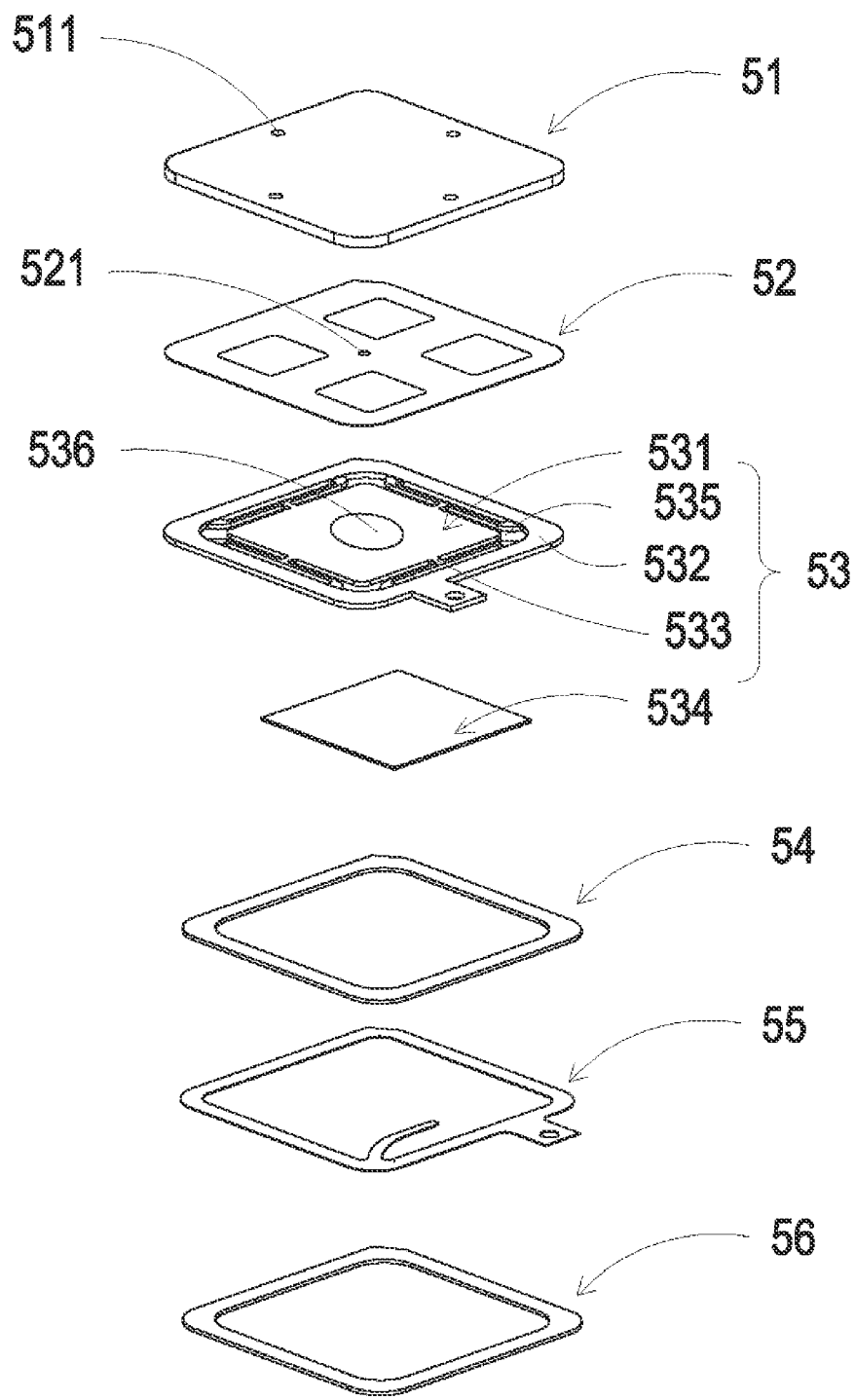
FIG. 12A illustrates an exploded view of the micro pump of the wearable display device according to an exemplary embodiment of the present disclosure.
Figure 12B:
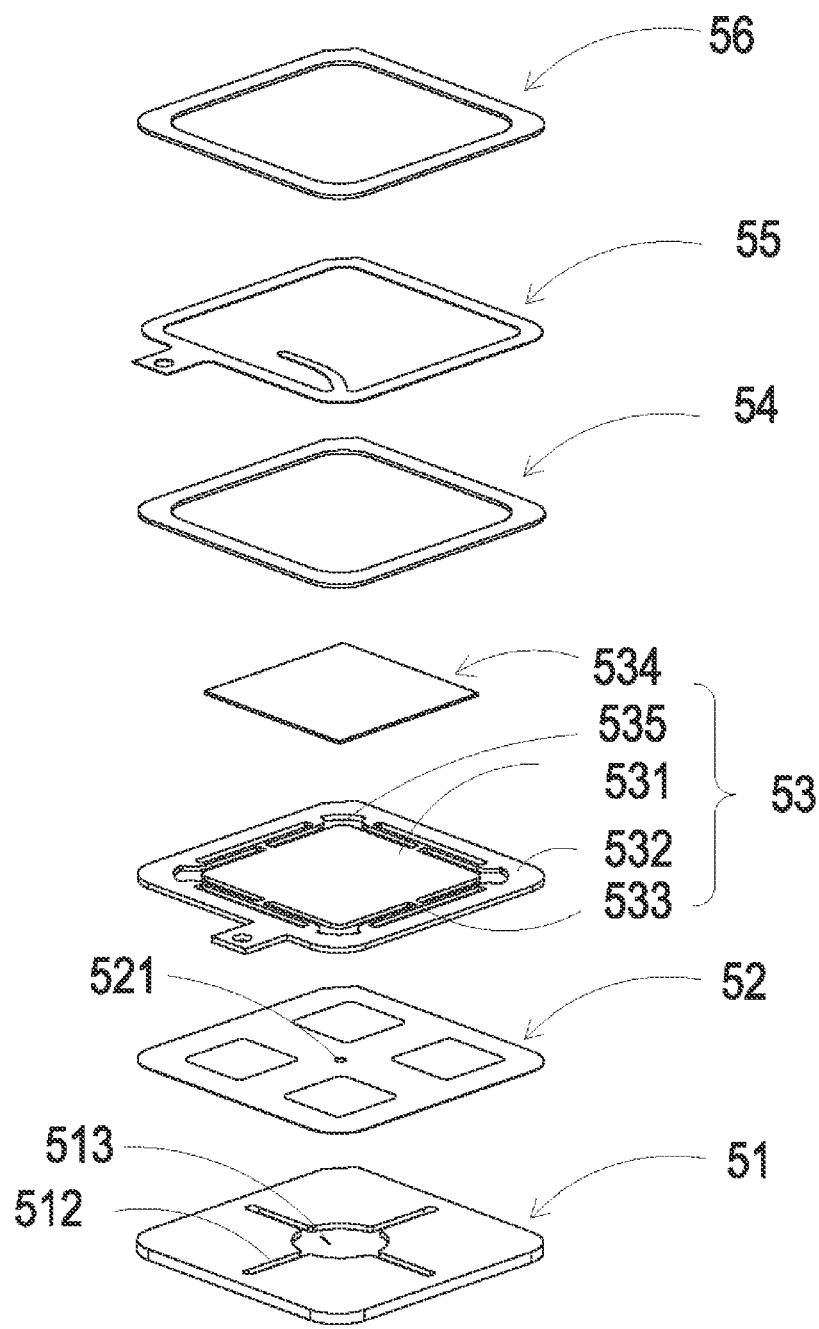
FIG. 12B illustrates an exploded view of the micro pump of the wearable display device according to the exemplary embodiment of the present disclosure, from another perspective.
Figure 13A:
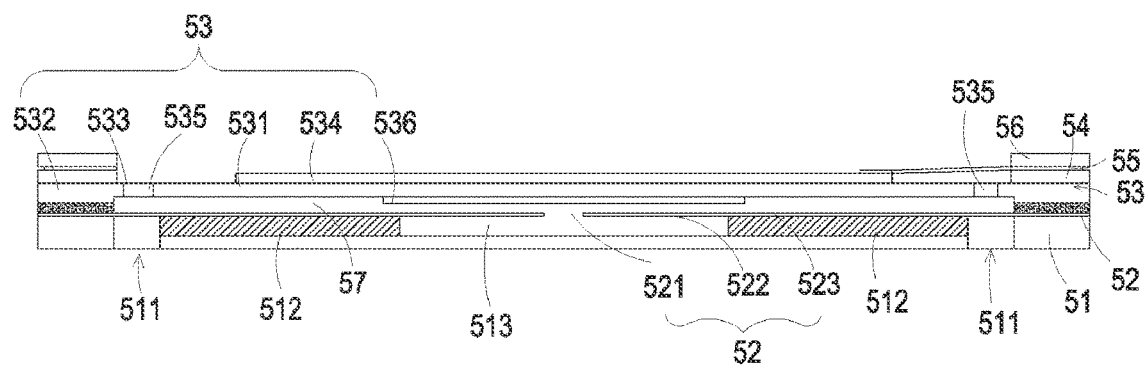
FIG. 13A illustrates a cross-sectional view of the micro pump of the wearable display device according to the exemplary embodiment of the present disclosure.

Please refer to FIG. 12A, FIG. 12B, and FIG. 13A. The resonance sheet 52 may be attached and assembled on the inlet plate 51. Furthermore, the resonance sheet 52 has a perforation 521, a movable portion 522, and a fixed portion 523. The perforation 521 is located at a center portion of the resonance sheet 52 and corresponds to the convergence chamber 513 of the inlet plate 51. The movable portion 522 is disposed at a periphery of the perforation 521 corresponding to a portion opposite to the convergence chamber 513. The fixed portion 523 is disposed at an outer periphery of the resonance sheet 52 and attached to the inlet plate 51.

Please still refer to FIG. 12A, FIG. 12B, and FIG. 13A. The piezoelectric actuator 53 includes a suspension plate 531, an outer frame 532, at least one supporting element 533, a piezoelectric element 534, at least one gap 535, and a protruding portion 536. In the embodiments of the present disclosure, the suspension plate 531 is in square shape. It is understood that, the reason why the suspension plate 531 adopts the square shape is that, comparing with a circle suspension plate having a diameter equal to the side length of the square suspension plate 531, the square suspension plate 531 has an advantage of saving electricity. The power consumption of a capacitive load operated under a resonance frequency may increase as the resonance frequency increases, and since the resonance frequency of a square suspension plate 531 is much lower than that of a circular suspension plate, the power consumption of the square suspension plate 531 is relatively low as well. Consequently, the square design of the suspension plate 531 used in one or some embodiments of the present disclosure has the benefit of power saving. In the embodiments of the present disclosure, the outer frame 532 is disposed around the periphery of the suspension plate 531. The at least one supporting element 533 is connected between the suspension plate 531 and the outer frame 532 to provide a flexible support for the suspension plate 531. In the embodiments of the present disclosure, the piezoelectric element 534 has a side length, which is shorter than or equal to a side length of the suspension plate 531. The piezoelectric element 534 is attached to a surface of the suspension plate 531 so as to drive the suspension plate 531 to bend and vibrate when the piezoelectric element 534 is applied with a voltage. There is at least one gap 535 formed between the suspension plate 531, the outer frame 532, and the at least one supporting element 533, and the at least one gap 535 is provided for the gas to flow therethrough. The protruding portion 536 is disposed on a surface of the suspension plate 531 opposite to the surface of the suspension plate 531 where the piezoelectric element 534 is attached. In this embodiment, the protruding portion 536 may be a convex structure protruding out from and integrally formed with the surface of the suspension plate 531 opposite to the surface of the suspension plate 531 where the piezoelectric element 534 is attached by performing an etching process on the suspension plate 531.

Please still refer to FIG. 12A, FIG. 12B, and FIG. 13A. In this embodiment, the inlet plate 51, the resonance sheet 52, the piezoelectric actuator 53, the first insulation plate 54, the conductive plate 55, and the second insulation plate 56 are stacked sequentially with each other, and a chamber space 57 is formed between the suspension plate 531 of the piezoelectric actuator 53 and the resonance sheet 52. The chamber space 57 can be formed by filling a material, such as conductive adhesive, between the resonance sheet 52 and the outer frame 532 of the piezoelectric actuator 53, but not limited thereto, so as to maintain a certain distance between the resonance sheet 52 and the suspension plate 531 and form the chamber space 57 to allow the gas to be guided and flow more quickly. Further, since an appropriate distance is maintained between the suspension plate 531 and the resonance sheet 52, the interference raised from the contact between the suspension plate 531 and the resonance sheet 52 can be reduced, so that the noise generation thus can be reduced as well. In other embodiments, the required thickness of the conductive adhesive between the resonance sheet 52 and the outer frame 532 of the piezoelectric actuator 53 can be decreased by increasing the height of the outer frame 532 of the piezoelectric actuator 53. Accordingly, the entire structure of the micro pump 5 would not be indirectly affected by the hot pressing temperature and the cooling temperature owing to the filling material of conductive adhesive, thereby avoiding the situation that the actual spacing of the chamber space 57 is affected by the thermal expansion and contraction of the filling material of the conductive adhesive, but not limited thereto. Moreover, the height of the chamber space 57 also affects the transmission efficiency of the micro pump 5. Therefore, it is important to maintain a fixed height of the chamber space 57 for the purpose of achieving stable transmission efficiency of the micro pump 5.

Figure 13B:
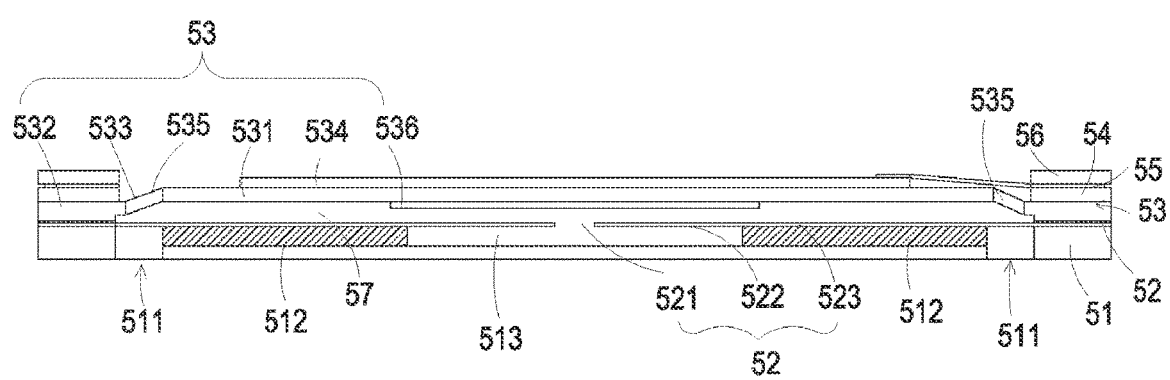
FIG. 13B illustrates a schematic view of the micro pump of the wearable display device according to another preferred exemplary embodiment of the present disclosure.

Therefore, as shown in FIG. 13B, in other embodiments of the piezoelectric actuator 53, the suspension plate 531 can be extended out with a certain distance by stamping. The extension distance can be adjusted by at least one supporting element 533 between the suspension plate 531 and the outer frame 532 so as to make the surface of the protruding portion 536 on the suspension plate 531 be not coplanar with the surface of the outer frame 532. The piezoelectric actuator 53 is assembled to the resonance sheet 52 by attaching the piezoelectric actuator 53 onto the fixed portion 523 of the resonance sheet 52 through hot pressing with applying a few amount of filling material (such as the conductive adhesive) on the assembly surface of the outer frame 532. In this embodiment, through the structure improvement of the chamber space 57 obtained by stamping the suspension plate 531 of the piezoelectric actuator 53 and maintaining a chamber space 57 between the surface of the suspension plate 531 and the resonance sheet 52, the required chamber space 57 can be obtained by directly adjusting the extension distance of the suspension plate 531 of the piezoelectric actuator 53. This could effectively simplify the structural design of the chamber space 57, and also simplify the manufacturing process and shortens the manufacturing time of the chamber space 57. Moreover, the first insulation sheet 54, the conductive sheet 55, and the second insulation sheet 56 are all thin sheets with a frame like structure, and the first insulation sheet 54, the conductive sheet 55, and the second insulation sheet 56 are sequentially stacked and assembled on the piezoelectric actuator 53 to form the main structure of the micro pump 5.

Figure 13C:
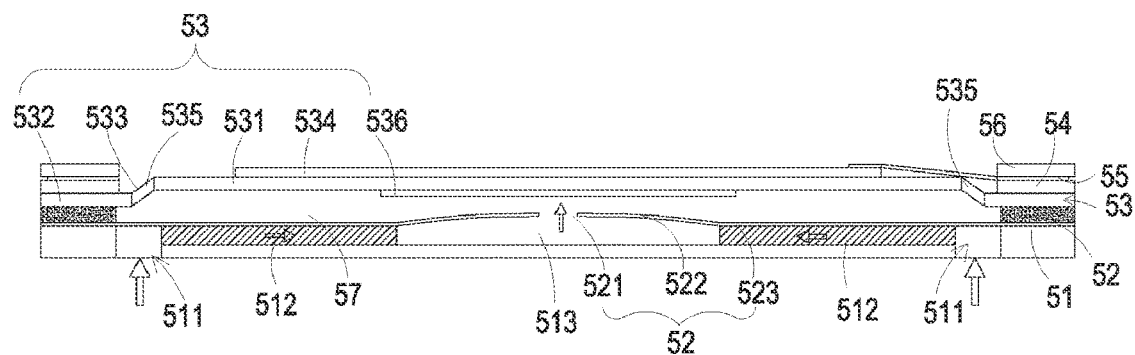
FIG. 13C to FIG. 13E illustrate schematic cross-sectional views showing the micro pump of the wearable display device at different operation steps.
Figure 13D:
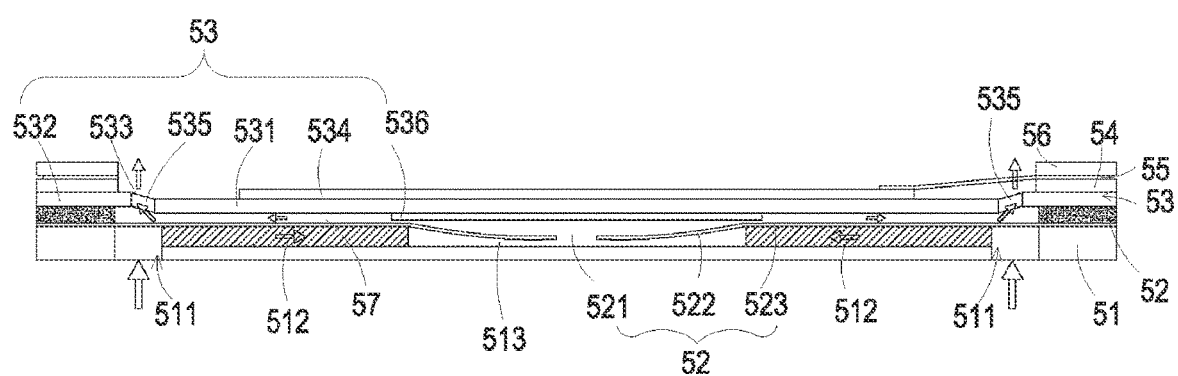
Figure 13E:
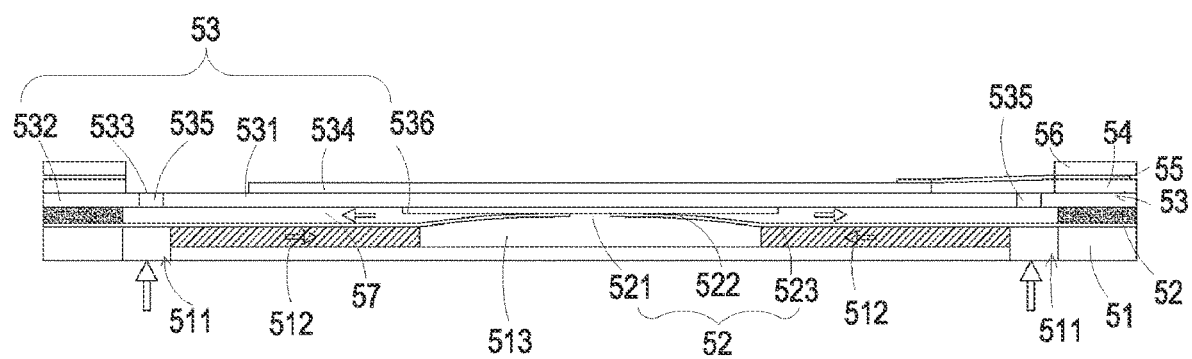
Figure 14:
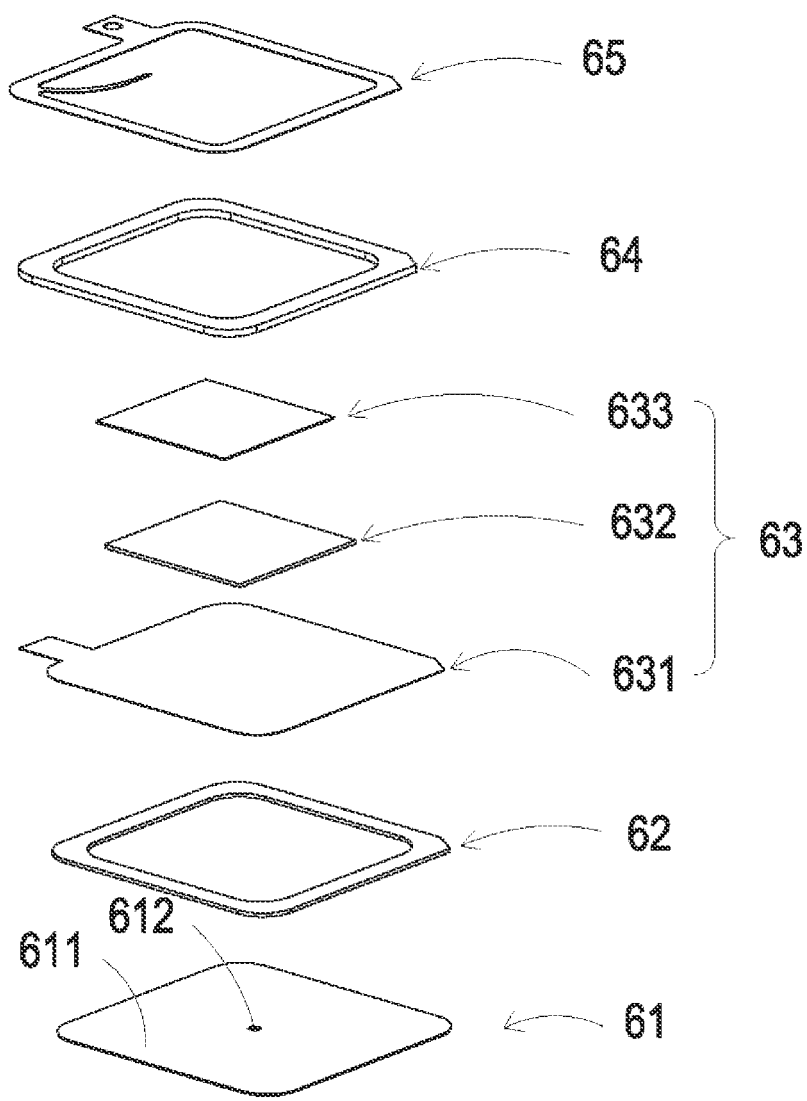
FIG. 14 illustrates an exploded view of the second actuator, as a blower-type micro pump, of the inflation actuation module of the wearable display device according to an exemplary embodiment of the present disclosure.

In order to understand the operation steps in transmitting gas of the aforementioned micro pump 5, please refer to FIG. 13C to FIG. 13E. Please refer to FIG. 13C first, the piezoelectric element 534 of the piezoelectric actuator 53 deforms after being applied with a driving voltage, and the piezoelectric element 534 drives the suspension plate 531 to move upwardly and to move away from the inlet plate 531. Thus, the volume of the chamber space 57 is increased to generate a negative pressure inside the chamber space 57, thereby drawing the gas in the convergence chamber 513a into the chamber space 57. At the same time, owing to the resonance effect, the resonance sheet 52 moves upwardly and away from the inlet plate 51, and thus increases the volume of the convergence chamber 513. Furthermore, since the gas inside the convergence chamber 513 is drawn into the chamber space 57, the convergence chamber 513 is in a negative pressure state, and the gas can be drawn into the convergence chamber 513 through the inlet hole 511 and the convergence channel 512. Then, please refer to FIG. 13D. The piezoelectric element 534 drives the suspension plate 531 to move downwardly toward the inlet plate 51, and compresses the chamber space 57. Similarly, since the movable portion 522 of the resonance sheet 52 resonates with the suspension plate 531, the resonance sheet 52 also moves downwardly and toward the inlet plate 51, thereby pushing the gas in the chamber space 57 to move upwardly to be transmitted out of the micro pump 5 through the at least one gap 535 so as to achieve gas transmission. Last, please refer to FIG. 13E. When the suspension plate 531 moves resiliently to its original position, the resonance sheet 52 still moves upwardly and away from the inlet plate 531 due to its inertia momentum. At this time, the resonance sheet 52 compresses the chamber space 57, so that the gas in the chamber space 57 is moved toward the gap 535 and the volume of the convergence chamber 513 is increased. Accordingly, the gas can be drawn into the convergence chamber 513 continuously through the inlet holes 511 and the convergence channels 512 and can be converged at the convergence chamber 513. Through continuously repeating the operation steps of the micro pump 5 shown in FIG. 13C to FIG. 13E, the micro pump 5 can make the gas continuously enter into the flow paths formed by the inlet plate 51 and the resonance sheet 52 from the inlet holes 511, thereby generating a pressure gradient. The gas is then transmitted outward through the gap 535. As a result, the gas can flow at a relatively high speed, thereby achieving the effect of gas transmission of the micro pump 5.

Please refer to FIG. 14 and FIG. 15A to FIG. 15C, a blower type micro pump 6 is illustrated. The blower type micro pump 6 includes a nozzle plate 61, a chamber frame 62, an actuation body 63, an insulation frame 64, and a conductive frame 65. The nozzle plate 61 is made of a flexible material, and the nozzle plate 61 has a suspension sheet 611 and a hollow hole 612. The suspension sheet 611b is a flexible sheet, which can bend and vibrate, but not limited thereto. The shape of the suspension sheet 611 may be one of square, circle, ellipse, triangle, and polygon. The hollow hole 612 penetrates the center portion of the suspension sheet 611 for allowing the gas to flow therethrough.

The chamber frame 62 is stacked on the nozzle plate 61, and the shape of the chamber frame 62 corresponds to the shape of the nozzle plate 61. The actuation body 63 is stacked on the chamber frame 62, and a resonance chamber 66 is formed between the chamber frame 62, the actuation body 63, and the suspension sheet 611. The insulation frame 62 is stacked on the actuation body 63. The appearance of the insulation frame 64 is similar to the appearance of the chamber frame 62. Moreover, the actuation body 63 further includes a piezoelectric carrier plate 631, an adjusting resonance plate 632, and a piezoelectric plate 633. The piezoelectric carrier plate 631 is stacked on the chamber frame 62.

The adjusting resonance plate 632 is stacked on the piezoelectric carrier plate 631. The piezoelectric plate 633 is stacked on the adjusting resonance plate 632. The adjusting resonance plate 632 and the piezoelectric plate 633 are accommodated in the insulation frame 64. The conductive frame 65 is electrically connected to the piezoelectric plate 633. The piezoelectric carrier plate 631 and the adjusting resonance plate 632 are both made of the conductive materials. The piezoelectric carrier plate 631 is electrically connected to a driving circuit (not shown) on the circuit board 15 so as to receive a driving signal (a driving frequency and a driving voltage). The piezoelectric carrier plate 631, the adjusting resonance plate 632, the piezoelectric plate 633, and the conductive frame 65 may together form a circuit for transmitting the driving signal, and the insulation frame 64 is provided for electrically isolating the conductive frame 65 from the actuation body 63 for avoiding short circuit, thereby the driving signal can be transmitted to the piezoelectric plate 633. When the piezoelectric plate 633 receives the driving signal (a driving frequency and a driving voltage), the piezoelectric plate 633 deforms owing to the piezoelectric effect, and thus the piezoelectric carrier plate 631 and the adjusting resonance plate 632 are driven to perform reciprocating vibration correspondingly.

As mentioned above, the adjusting resonance plate 632 is disposed between the piezoelectric plate 633 and the piezoelectric carrier plate 631 as a cushion element so as to adjust the vibration frequency of the piezoelectric carrier plate 631. Generally, the thickness of the adjusting resonance plate 632 is greater than the thickness of the piezoelectric carrier plate 631. The thickness of the adjusting resonance plate 632 may be changed to adjust the vibration frequency of the actuation body 63.

Figure 15A:
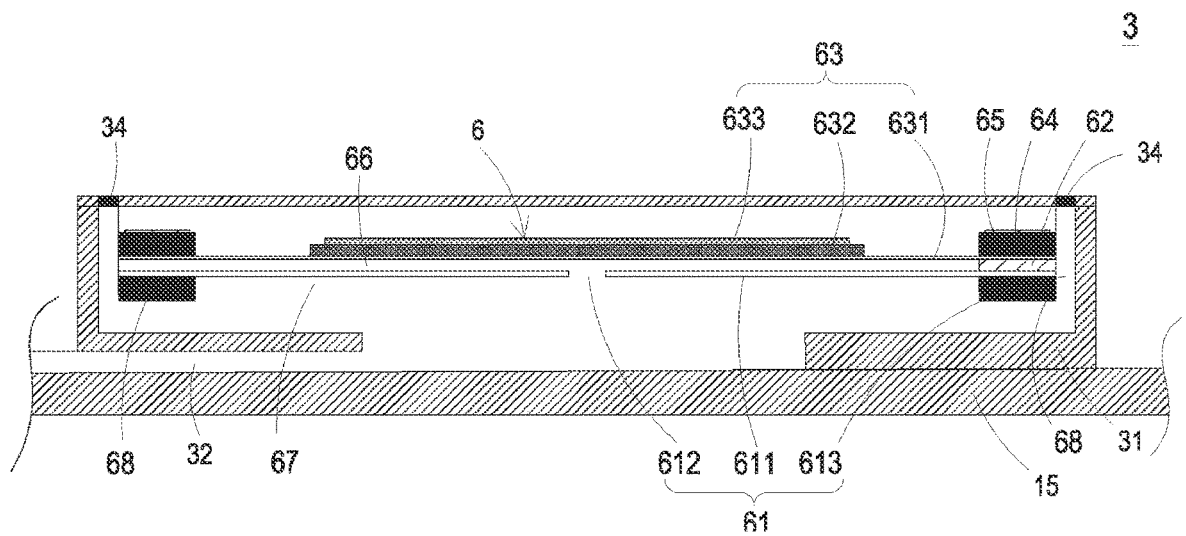
FIG. 15A illustrates a cross-sectional view of the second actuator, as a blower-type micro pump, of the inflation actuation module of the wearable display device according to the exemplary embodiment of the present disclosure.
Figure 15B:
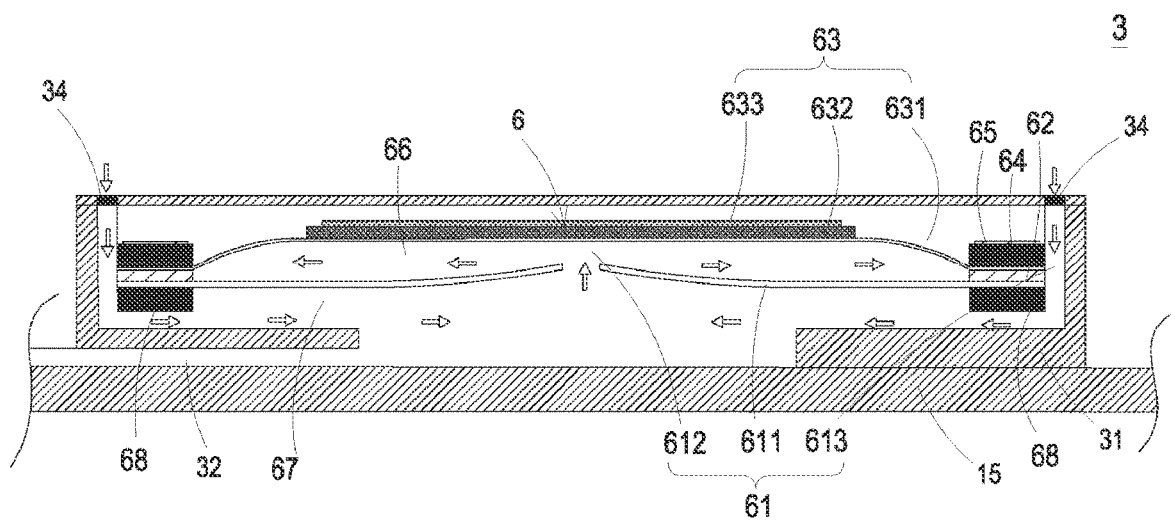
FIG. 15B and FIG. 15C illustrate schematic cross-sectional views showing the second actuator as a blower type micro pump shown in FIG. 15A at different operation steps.
Figure 15C:
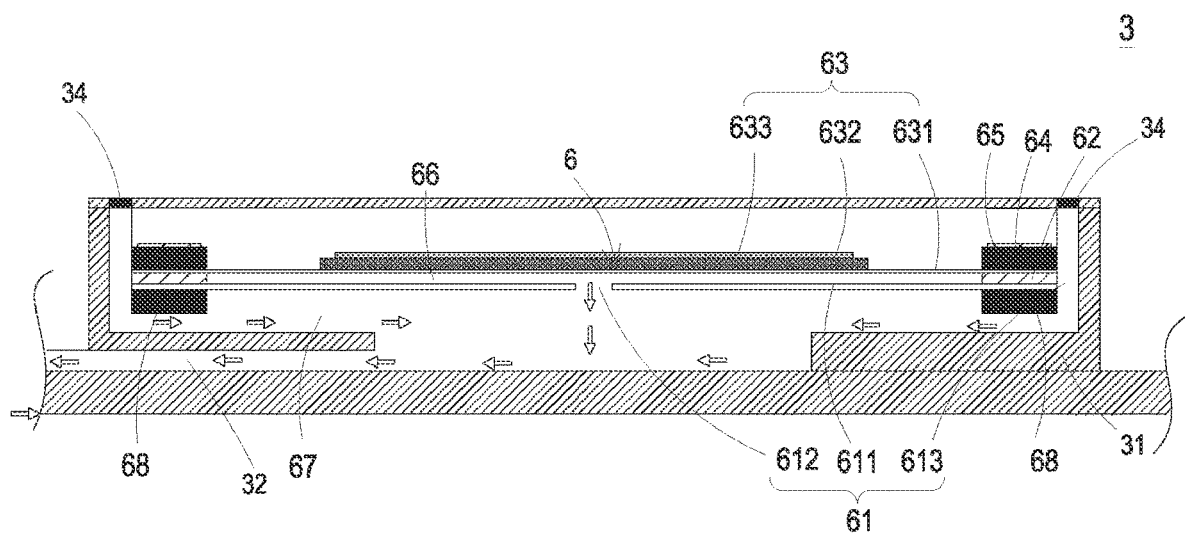

Please refer to FIG. 15A, FIG. 15B, and FIG. 15C. The nozzle plate 61, the chamber frame 62, the actuation body 63, the insulation frame 64, and the conductive frame 65 are sequentially stacked and assembled with each other. The bottom of the nozzle plate 61 is supported and positioned on a positioning bump 68, so that a surrounding gap 613 is defined between an outer portion and a bottom portion of the suspension sheet 611 of the blower type micro pump 6 for gas to pass therethrough.

Please refer to FIG. 15A first. A gas flow chamber 67 is formed between a bottom of the nozzle plate 61 and the bottom surface of the positioning bump 68. The gas flow chamber 67 is in communication with, through the hollow hole 612 of the nozzle plate 61, the resonance chamber 66 formed between the actuation body 63, the chamber frame 62, and the suspension sheet 611. Through controlling the vibration frequency of the gas in the resonance chamber 66 and making the vibration frequency of the gas in the resonance chamber 66 nearly the same with the vibration frequency of the suspension sheet 611, the resonance chamber 66 and the suspension sheet 611 can generate the Helmholtz resonance effect so as to improve the transmission efficiency of the gas.

Please refer to FIG. 15B. When the piezoelectric plate 633 moves in a direction away from the bottom surface of the positioning bump 68, the piezoelectric plate 633 drives the suspension sheet 611 of the nozzle plate 61 to move in the direction away from the bottom surface of the positioning bump 68 correspondingly. Hence, the volume of the gas flow chamber 67 expands dramatically, so that the internal pressure of the gas flow chamber 67 decreases and creates a negative pressure, thereby drawing the gas outside the blower type micro pump 6 to flow into the blower type micro pump 6 through the surrounding gap 613 and enter into the resonance chamber 66 through the hollow hole 612, thereby increasing the gas pressure of the resonance chamber 66 and thus generating a pressure gradient. Further, as shown in FIG. 15C, when the piezoelectric plate 633 drives the suspension sheet 611 of the nozzle plate 61 to move toward the bottom surface of the positioning bump 68, the gas inside the resonance chamber 66 is pushed to flow out quickly through the hollow hole 612 so as to further push the gas inside the gas flow chamber 67, thereby the converged gas can be quickly and massively ejected out of the bottom surface of the positioning bump 68 in a state closing to an ideal gas state under the Benulli's law. Therefore, through repeating the steps as shown in FIG. 15B and FIG. 15C, the piezoelectric plate 633 can bend and vibrate reciprocatingly. Further, after the gas is discharged out of the resonance chamber 66, the internal pressure of the resonance chamber 66 is lower than the equilibrium pressure due to the inertia, as a result, the pressure difference guides the gas outside the resonance chamber 66 into the resonance chamber 66 again. Thus, through controlling the vibration frequency of the gas inside the resonance chamber 66 to be close the vibration frequency of the piezoelectric plate 633 and generate the Helmholtz resonance effect, high-speed and large-volume gas transmission can be achieved.

Please refer to FIG. 17A, FIG. 17B and FIG. 18A to FIG. 18C, a microelectromechanical systems (MEMS) micro pump 7 is illustrated. The MEMS micro pump 7 has a reduced size through surface micromachining techniques. The MEMS micro pump 7 includes a substrate 71, an oxide layer 72, a vibration layer 73, and a piezoelectric component 74. The substrate 71 is a silicon substrate and formed with at least one inlet 711 by etching.

The oxide layer 72 formed and stacked on the substrate 71 by deposition is formed with a plurality of convergence troughs 721 and a convergence chamber 722 by etching. The convergence channels 721 are in communication between the at least one inlet 711 of the substrate 71 and the convergence chamber 722. The deposition process may be a physical vapor deposition (PVD) process, a chemical vapor deposition (CVD) process, or a combination thereof, but not limited thereto. The detailed descriptions about the deposition process are omitted.

The vibration layer 73 is formed and stacked on the oxide layer 72 by deposition. The vibration layer 73 includes a silicon wafer layer 731, a second oxide layer 732, and a metal layer 733. The metal layer 733 formed and stacked on the oxide layer 72 by deposition is formed with a through hole 7331, a vibration portion 7332, and a fixed portion 7333 by etching. The etching process may be a wet etching process, a dry etching process, or a combination thereof, but not limited thereto. The detailed descriptions about the etching process are omitted.

The through hole 7331 is formed at a center portion of the metal layer 733 by etching. The vibration portion 7332 is formed on a periphery of the through hole 7331. The fixed portion 7333 is formed on a periphery of the metal layer 733.

The second oxide layer 732 is formed and stacked on the metal layer 733 by deposition, and the second oxide layer 732 is formed with an oxide layer hole 7321 by etching.

The silicon wafer layer 731 formed and stacked on the second oxide layer 732 by deposition is formed with an actuation portion 7311, an outer peripheral portion 7312, a plurality of connection portions 7313, and a plurality of fluid channels 7314 by etching. The actuation portion 7311 is formed at a center portion of the silicon wafer layer 731. The outer peripheral portion 7312 is formed on and surrounds a periphery of the actuation portion 7311. The connection portions 7313 are respectively connected between the actuation portion 7311 and the outer peripheral portion 7312. The fluid channels 7314 are respectively formed between the actuation portion 7311 and the outer peripheral portion 7312 and between the connection portions 7313. Accordingly, a compression chamber is formed by the silicon wafer layer 731 and the oxide layer hole 7321 of the second oxide layer 732.

The piezoelectric component 74 formed and stacked on the actuation portion 7311 of the silicon wafer layer 731 by deposition includes a lower electrode layer 741, a piezoelectric layer 742, an insulation layer 743, and an upper electrode layer 744. The lower electrode layer 741 is stacked and formed on the actuation portion 7311 of the silicon wafer layer 731 by deposition, and the piezoelectric layer 742 is stacked and formed on the lower electrode layer 741. The insulation layer 743 is formed and stacked on a portion of a surface of the piezoelectric layer 742 and on a portion of a surface of the lower electrode layer 741 by deposition, and the upper electrode layer 744 is stacked on the insulation layer 743 and the remaining portion of the surface of the piezoelectric layer 742 which is not covered by the insulation layer 743, and the upper electrode layer 744 is provided for electrically connected to the piezoelectric layer 742.

Figure 18A:
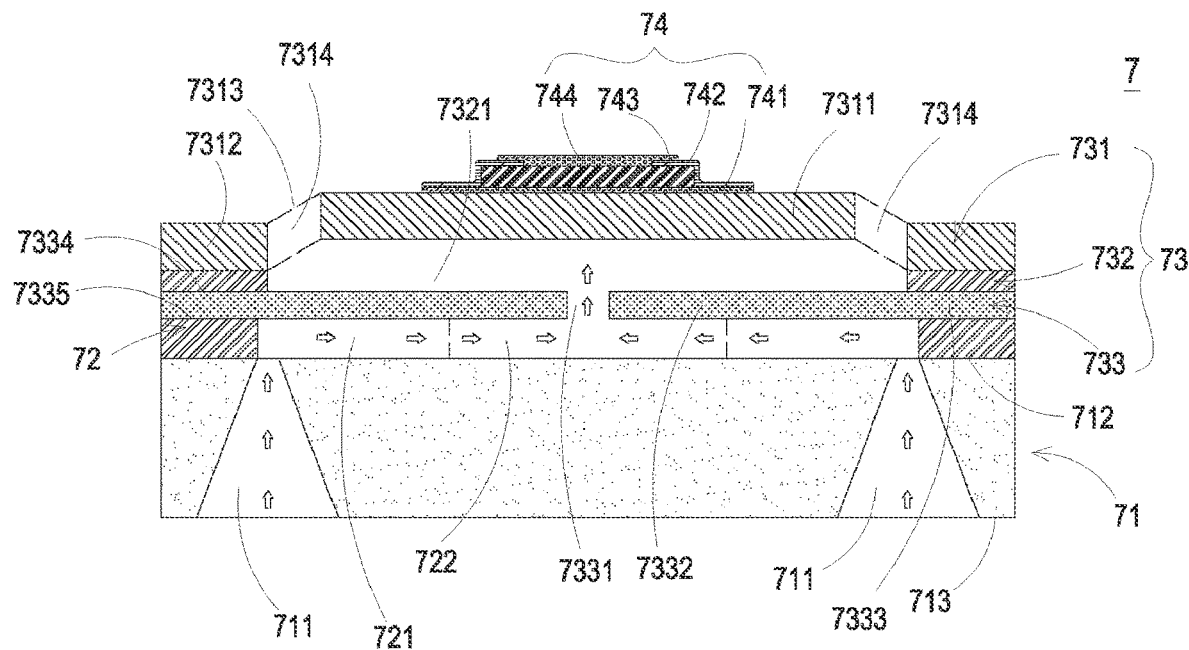
FIG. 18A to FIG. 18C illustrate schematic cross-sectional views showing the MEMS micro pump of the wearable display device at different operation steps.
Figure 18B:
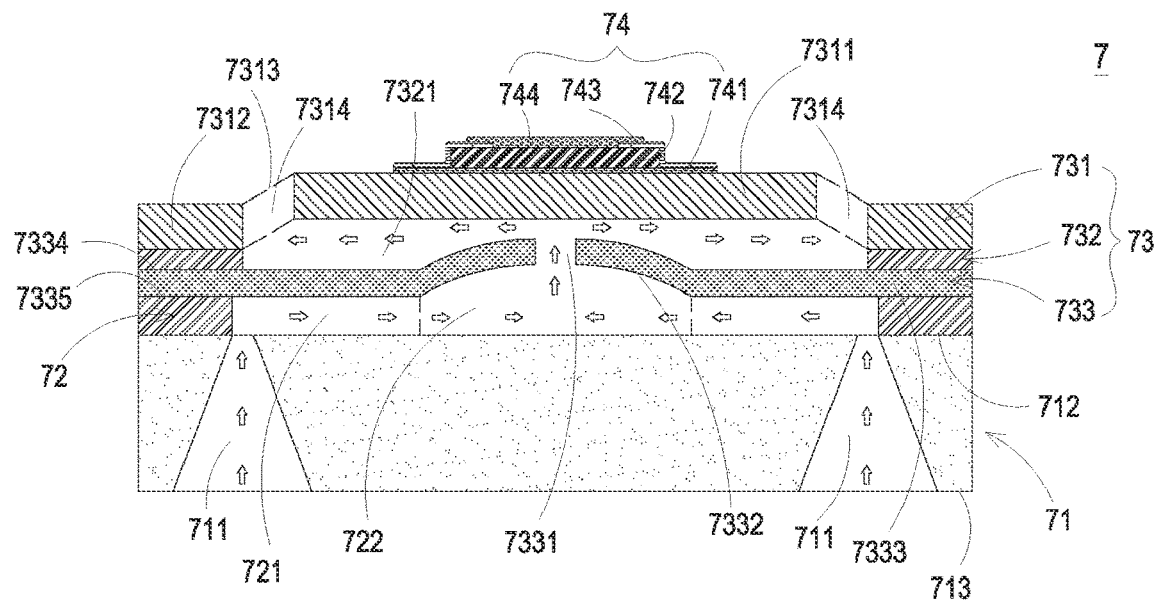
Figure 18C:
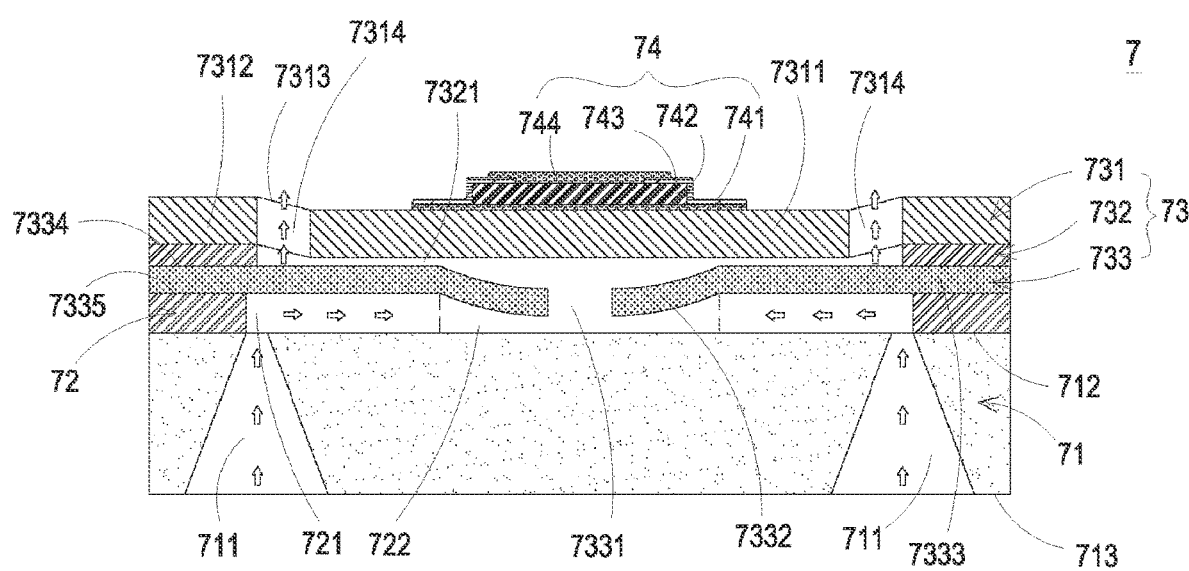

Regarding how the MEMS micro pump 7 performs the gas transmission, please refer to FIG. 18A. When the lower electrode layer 741 and the upper electrode layer 744 of the piezoelectric component 74 receive a driving signal (not shown in the figure), the piezoelectric layer 742 starts to deform because of the reverse piezoelectric effect, thereby driving the actuation portion 7311 of the silicon wafer layer 731 to move correspondingly. When the actuation portion 7311 is driven by the piezoelectric component 74 away from the second oxide layer 732 and thus the distance between the actuation portion 7311 and the second oxide layer 732 increases, the volume of the compression chamber increases as well, and a negative pressure is created in the compression chamber as a result, and thus the gas outside the substrate 71 is drawn into the compression chamber through the inlet 711, and further enters into the convergence troughs 721 and the convergence chamber 722 of the oxide layer 72. Please refer to FIG. 18B, when the actuation portion 7311 is driven by the piezoelectric component 74, the vibration portion 7332 of the metal layer 733 is moved due to the resonance effect. When the vibration portion 7332 is moved, the space of the compression chamber is compressed and the gas in the compression chamber is pushed to the fluid channels 7314 of the silicon wafer layer 731. Please refer to FIG. 18C. When the piezoelectric component 74 drives the actuation portion 7311 of the silicon wafer layer 731 to move in an opposite direction, the vibration portion 7332 of the metal layer 733 is also driven and moved by the actuation portion 7311, so that the gas can be transmitted through the fluid channels 7314 and thus forces the gas in convergence chamber 722 to enter into the compression chamber through the through hole 7331 at the same time. Hence, when the actuation portion 7331 is driven by the piezoelectric component 74 again later, the volume of the compression chamber dramatically increases, thereby generating a larger suction force to draw the gas into the compression chamber. Through repeating the aforementioned steps mentioned in FIG. 18A to FIG. 18C, the actuation portion 7311 can be continually driven by the piezoelectric component 74 to move reciprocatingly, and the vibration portion 7332 is also driven to move reciprocatingly correspondingly. Thus, the internal pressure of the compression chamber of the MEMS micro pump 7 can be changed periodically so as to draw and discharge the gas continually, thereby completing the pumping process of the MEMS micro pump 7.

According to foregoing paragraphs, the first actuator 21, the second actuator 33, and each of the third actuators of the set of third actuators 4 may be a micro pump, a blower type micro pump, or a MEMS micro pump. An embodiment in which the blower type micro pump 6 is applied to the inflation actuation module 3 is further described in the following paragraphs. As shown in FIG. 2A and FIG. 2B, in this embodiment, the second actuator is a blower type micro pump. Please further refer to FIG. 15A, FIG. 15B, and FIG. 15C. The nozzle plate 61, the chamber frame 62, the actuation body 63, the insulation frame 64, and the conductive frame 65 of the blower type micro pump 6 are sequentially stacked and assembled with each other and the blower type micro pump 6 is disposed and positioned in the base member 31, so that the bottom of the nozzle plate 61 is supported and positioned on the positioning bump 68. Therefore, a surrounding gap 613 is defined between the inner edge of the suspension sheet 611 of the blower type micro pump 6 and the inner edge of the base member 31 for gas to pass therethrough. The valve component 34 correspond to the surrounding gap 613 and covers the whole base member 31 so as to control the gas introduction of the blower type micro pump 6.

Please refer to FIG. 15A first. A gas flow chamber 67 is formed between a bottom of the nozzle plate 61 and the bottom surface of the base member 31. The gas flow chamber 67 is in communication with, through the hollow hole 612 of the nozzle plate 61, the resonance chamber 66 formed between the actuation body 63, the chamber frame 62, and the suspension sheet 611. Through controlling the vibration frequency of the gas in the resonance chamber 66 and making the vibration frequency of the gas in the resonance chamber 66 nearly the same with the vibration frequency of the suspension sheet 611, the resonance chamber 66 and the suspension sheet 611 can generate the Helmholtz resonance effect so as to improve the transmission efficiency of the gas.

Please refer to FIG. 15B. When the piezoelectric plate 633 moves in a direction away from the bottom surface of the base member 31, the piezoelectric plate 633 drives the suspension sheet 611 of the nozzle plate 61 to move in the direction away from the bottom surface of the base member 31 correspondingly. Hence, the volume of the gas flow chamber 67 expands dramatically, so that the internal pressure of the gas flow chamber 67 decreases and creates a negative pressure, thereby drawing the gas outside the blower type micro pump 6 to flow into the blower type micro pump 6 through the surrounding gap 613 and enter into the resonance chamber 66 through the hollow hole 612, thereby increasing the gas pressure of the resonance chamber 66 and thus generating a pressure gradient. Further, as shown in FIG. 15C, when the piezoelectric plate 633 drives the suspension sheet 611 of the nozzle plate 61 to move toward the bottom surface of the base member 31, the gas inside the resonance chamber 66 is pushed to flow out quickly through the hollow hole 612 so as to further push the gas inside the gas flow chamber 67, thereby the converged gas can be quickly and massively ejected out of the bottom surface of the base member 31 and into the gas communication channel 32 in a state closing to an ideal gas state under the Benulli's law. Therefore, through repeating the steps as shown in FIG. 15B and FIG. 15C, the piezoelectric plate 633 can bend and vibrate reciprocatingly. Further, after the gas is discharged out of the resonance chamber 66, the internal pressure of the resonance chamber 66 is lower than the equilibrium pressure due to the inertia, as a result, the pressure difference guides the gas outside the resonance chamber 66 into the resonance chamber 66 again. Thus, through controlling the vibration frequency of the gas inside the resonance chamber 66 to be close the vibration frequency of the piezoelectric plate 633 and generate the Helmholtz resonance effect, high-speed and large-volume gas transmission can be achieved.

As mentioned above, as shown in FIG. 4, the valve component 34 covers the second actuator 33. Moreover, please refer to FIG. 15A to FIG. 15C. The valve component 34 corresponds to the surrounding gap 613 of the blower type micro pump 6. When the blower type micro pump 6 and the valve component 34 are driven, the valve component 34 is opened to control the gas introduction of the blower type micro pump 6, and the blower type micro pump 6 is actuated to transmit the gas to the gas communication channel 32 for gas collection, and the blower type micro pump 6 further transmits the gas to the fillable gas bag 13 for inflating the fillable gas bag 13 at the wearing surface of the device body 1, so as to allow a user to wear the wearable display device stably.

Accordingly, in the wearable display device according to one or some embodiments of the present disclosure, the heat dissipation processing module construed by the first actuator of the micro pump can perform heat dissipation effectively for the microprocessing chip inside the wearable display device so as to improve the operation efficiency of the microprocessing chip. Hence, the entire device may be miniaturized and can perform the heat dissipation function quietly. Moreover, the second actuator of the micro pump is provided for inflating the fillable gas bag, so that the wearable display device can provide wearing comfortableness even when the wearable display device is worn by the user for a long time. Furthermore, the third actuator of the micro pump and the intraocular pressure detector are provided for detecting the intraocular pressure of the user, so as to provide a notification to prevent the user from feeling dizzy or from having excessive intraocular pressure and cause damages for the user or affect the health for the user.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A wearable display device, comprising:
    a device body comprising a front cover, a side cover, a fillable gas bag, a circuit board, and a microprocessor, wherein the side cover is connected to one side of the front cover, the fillable gas bag is attached to and positioned on one side of the side cover, the circuit board is disposed and positioned on an inner portion of the side cover, and the microprocessor is packaged on the circuit board;
    a heat dissipation processing module comprising a first actuator, wherein the first actuator corresponds to the microprocessor, and the first actuator is provided for transmitting gas to the microprocessor so as to perform heat exchange for the microprocessor; and
    an inflation actuation module disposed on the circuit board, wherein the inflation actuation module comprises a base member, a gas communication channel, a second actuator, and a valve component, the base member is positioned on the circuit board and is in communication with the gas communication channel, the second actuator is disposed and positioned in the base member, the gas communication channel is in communication with the fillable gas bag, and the valve component is disposed on the base member and is driven to be opened or closed to control gas introduction of the second actuator;
    wherein when the second actuator and the valve component are driven, the valve component is opened to control the gas introduction of the second actuator, and the second actuator is actuated to transmit the gas to the gas communication channel for gas collection, and the second actuator further transmits the gas to the fillable gas bag for inflating the fillable gas bag, so as to allow a user to wear the wearable display device stably.

2. The wearable display device according to claim 1, wherein the heat dissipation processing module comprises a thermal conductive tube, the thermal conductive tube contacts a heat-generating surface of the microprocessor, a heat dissipation liquid is contained inside the thermal conductive tube, the first actuator is disposed and positioned on a surface of the thermal conductive tube, so that the first actuator is actuated to transmit the gas to perform heat exchange for the heat dissipation liquid in the thermal conductive tube, thereby allowing the thermal conductive tube to accelerate heat exchange for heats generated by the microprocessor.

3. The wearable display device according to claim 2, wherein the heat dissipation module comprises a liquid pump being in communication with the thermal conductive tube, thereby allowing the heat dissipation liquid in the thermal conductive tube to be drawn by the liquid pump and cycled within the thermal conductive tube and thus accelerating heat exchange for the thermal conductive tube.

4. The wearable display device according to claim 2, wherein the heat dissipation processing module comprises a positioning accommodation base disposed on the thermal conductive tube, the positioning accommodation base has a vent hole, the first actuator is disposed and positioned in the positioning accommodation base, so that the first actuator is actuated to transmit the gas through the vent hole to perform heat exchange for the thermal conductive tube.

5. The wearable display device according to claim 1, wherein the heat dissipation processing module comprises a positioning accommodation base disposed on the circuit board, the positioning accommodation base has a vent hole, the first actuator is disposed and positioned in the positioning accommodation base, so that the first actuator is actuated to transmit the gas through the vent hole to perform heat exchange for the microprocessor.

6. The wearable display device according to claim 1, wherein the device body further comprises a communication device packaged on the circuit board, and the communication device is provided for performing dual-direction data transmission wirelessly through Bluetooth or Wi-Fi.

7. The wearable display device according to claim 1, wherein the device body further comprises:
    a display assembly disposed in the side cover, wherein the display assembly is provided for displaying an image processed by the microprocessor;
    an intraocular pressure detection assembly, wherein each of intraocular pressure detectors of the intraocular pressure detection assembly is disposed at a center point of a corresponding monitor of the display assembly, wherein the intraocular pressure detection assembly is electrically connected to the circuit board, and the intraocular pressure detection assembly is provided for emitting an infrared light and detecting a light energy of a reflected light of the infrared light;
a set of third actuators, wherein each of third actuators of the set of third actuators is disposed at a lower portion of the corresponding monitor of the display assembly, wherein the set of third actuators is electrically connected to the circuit board, and the set of third actuators is provided for being actuated to generate a pulse gas;
wherein after the set of third actuators is driven to generate the pulse gas, the intraocular pressure detection assembly emits the infrared light and calculates the light energy of the reflected light of the infrared light, so that the intraocular pressure detection assembly is capable of detecting an intraocular pressure data of the wearer, thereby allowing the wearable display device to display the intraocular pressure data and provide a notification.

8. The wearable display device according to claim 7, wherein each of the third actuators is a micro pump.

9. The wearable display device according to claim 8, wherein the micro pump comprises:
an inlet plate having at least one inlet hole, at least one convergence channel, and a convergence chamber, wherein the at least one inlet hole is used to introduce the gas to flow into the micro pump, the at least one inlet hole correspondingly penetrates the at least one convergence channel, and the at least one convergence channel is converged at the convergence chamber, so that the gas introduced from the at least one inlet hole is converged at the convergence chamber;
a resonance sheet attached to the inlet plate, wherein the resonance sheet has a perforation, a movable portion, and a fixed portion, wherein the perforation is located at a center portion of the resonance sheet and corresponds to the convergence chamber of the inlet plate, the movable portion is disposed at a periphery of the perforation corresponds to a portion opposite to the convergence chamber, and the fixed portion is disposed at an outer periphery of the resonance sheet and attached to the inlet plate; and
a piezoelectric actuator attached to the resonance sheet and disposed correspondingly to the resonance sheet;
wherein a chamber space is formed between the resonance sheet and the piezoelectric actuator, so that when the piezoelectric actuator is driven, the gas outside the micro pump is introduced into the micro pump through the at least one inlet hole of the inlet plate, is converged at the convergence chamber via the at least one convergence channel, flows through the perforation of the resonance sheet, and is transmitted outwardly by a resonance effect resulting between the piezoelectric actuator and the movable portion of the resonance sheet.

10. The wearable display device according to claim 7, wherein each of the third actuators is a blower type micro pump.

11. The wearable display device according to claim 10, wherein the blower-type micro pump comprises:
a nozzle plate comprising a suspension sheet and a hollow hole, wherein the suspension sheet is capable of bending and vibrating, and the hollow hole is formed at a center portion of the suspension sheet;
a chamber frame stacked on the suspension sheet;
an actuation body comprising a piezoelectric carrier plate, an adjusting resonance plate, and a piezoelectric plate, wherein the piezoelectric carrier plate is stacked on the chamber frame, the adjusting resonance plate stacked on the piezoelectric carrier plate, the piezoelectric plate is stacked on the adjusting resonance plate, and the piezoelectric plate is provided for driving the piezoelectric carrier plate and the adjusting resonance plate to bend and vibrate reciprocatingly when the piezoelectric plate is applied with the voltage;
an insulation frame stacked on the actuation body; and
a conductive frame stacked on the insulation frame;
wherein the nozzle plate is fixedly disposed and positioned to define a gap outside the nozzle plate and to define a gas flow chamber at a bottom of the nozzle plate for gas flowing, and a resonance chamber is formed between the actuation body, the chamber frame, and the suspension sheet, and wherein the nozzle plate is driven to move correspondingly by driving the actuation body, so that the suspension sheet of the nozzle plate vibrates reciprocatingly, and thus drawing the gas entering into the gas flow chamber through the gap and then discharging out of the gas flow chamber, thereby achieving transmission of the gas.

12. The wearable display device according to claim 7, wherein each of the third actuators is an MEMS micro pump.

13. The wearable display device according to claim 12, wherein the MEMS micro pump comprises:
a substrate formed with at least one inlet by etching;
an oxide layer formed and stacked on the substrate by deposition, wherein the oxide layer is formed with a plurality of convergence channels and a convergence chamber by etching, and the convergence channels are in communication between the at least one inlet of the substrate and the convergence chamber; and
a vibration layer formed and stacked on the oxide layer by deposition, wherein the vibration layer comprises:
a metal layer formed and stacked on the oxide layer by deposition, wherein the metal layer is formed with a through hole, a vibration portion, and a fixed portion by etching, the through hole is formed at a center portion of the metal layer, the vibration portion is formed on a periphery of the through hole, and the fixed portion is formed on a periphery of the metal layer;
a second oxide layer formed and stacked on the metal layer by deposition, wherein the second oxide layer is formed with an oxide layer hole by etching; and
a silicon wafer layer formed and stacked on the second oxide layer by deposition, wherein the silicon wafer layer is formed with an actuation portion, an outer peripheral portion, a plurality of connection portions, and a plurality of fluid channels by etching, wherein the actuation portion is formed at a center portion of the silicon wafer layer, the outer peripheral portion is formed on and surrounds a periphery of the actuation portion, the connection portions are respectively connected between the actuation portion and the outer peripheral portion, and the fluid channels are respectively form between the actuation portion and the outer peripheral portion and between the connection portions, and wherein a compression chamber is defined by the silicon wafer layer and the oxide layer hole of the second oxide layer; and a piezoelectric component formed and stacked on the actuation portion of the silicon wafer layer by deposition, wherein the piezoelectric component comprises a lower electrode layer, a piezoelectric layer, an insulation layer, and an upper electrode layer, wherein the piezoelectric layer is formed and stacked on the lower electrode layer by deposition, the insulation layer is formed and stacked on a portion of a surface of the piezoelectric layer and on a portion of a surface of the lower electrode layer by deposition, the upper electrode layer is formed and stacked on the insulation layer and a remaining portion of the surface of the piezoelectric layer where the insulation layer is not disposed, and the upper electrode layer is provided for electrically connecting to the piezoelectric layer;

wherein when the piezoelectric component is driven, the gas outside the MEMS micro pump is introduced into the MEMS micro pump through the at least one inlet hole of the inlet plate, converged at the convergence chamber via the at least one convergence channel, flowed through the perforation of the resonance sheet, and transmitted outwardly by a resonance effect resulting between the piezoelectric component and the actuation portion of the vibration portion.

14. The wearable display device according to claim 1, wherein the first actuator and the second actuator are respectively micro pumps.

15. The wearable display device according to claim 14, wherein the micro pump comprises:
an inlet plate having at least one inlet hole, at least one convergence channel, and a convergence chamber, wherein the at least one inlet hole is used to introduce the gas to flow into the micro pump, the at least one inlet hole correspondingly penetrates the at least one convergence channel, and the at least one convergence channel is converged at the convergence chamber, so that the gas introduced from the at least one inlet hole is converged at the convergence chamber;
a resonance sheet attached to the inlet plate, wherein the resonance sheet has a perforation, a movable portion, and a fixed portion, wherein the perforation is located at a center portion of the resonance sheet and corresponds to the convergence chamber of the inlet plate, the movable portion is disposed at a periphery of the perforation corresponding to a portion opposite to the convergence chamber, and the fixed portion is disposed at an outer periphery of the resonance sheet and attached to the inlet plate; and
a piezoelectric actuator attached to the resonance sheet and disposed correspondingly to the resonance sheet;
wherein a chamber space is formed between the resonance sheet and the piezoelectric actuator, so that when the piezoelectric actuator is driven, the gas outside the micro pump is introduced into the micro pump through the at least one inlet hole of the inlet plate, is converged at the convergence chamber via the at least one convergence channel, flows through the perforation of the resonance sheet, and is transmitted outwardly by a resonance effect resulting between the piezoelectric actuator and the movable portion of the resonance sheet.

16. The wearable display device according to claim 1, wherein the first actuator and the second actuator are blower type micro pumps respectively.

17. The wearable display device according to claim 16, wherein the blower type micro pump comprises:

a nozzle plate comprising a suspension sheet and a hollow hole, wherein the suspension sheet is capable of bending and vibrating, and the hollow hole is formed at a center portion of the suspension sheet;
a chamber frame stacked on the suspension sheet;
an actuation body comprising a piezoelectric carrier plate, an adjusting resonance plate, and a piezoelectric plate, wherein the piezoelectric carrier plate is stacked on the chamber frame, the adjusting resonance plate stacked on the piezoelectric carrier plate, the piezoelectric plate is stacked on the adjusting resonance plate, and the piezoelectric plate is provided for driving the piezoelectric carrier plate and the adjusting resonance plate to bend and vibrate reciprocatingly when the piezoelectric plate is applied with the voltage;
an insulation frame stacked on the actuation body; and
a conductive frame stacked on the insulation frame;
wherein the nozzle plate is fixedly disposed and positioned to define a gap outside the nozzle plate and to define a gas flow chamber at a bottom of the nozzle plate for gas flowing, and a resonance chamber is formed between the actuation body, the chamber frame, and the suspension sheet, and wherein the nozzle plate is driven to move correspondingly by driving the actuation body, so that the suspension sheet of the nozzle plate vibrates reciprocatingly, and thus drawing the gas entering into the gas flow chamber through the gap and then discharging out of the gas flow chamber, thereby achieving transmission of the gas.

18. The wearable display device according to claim 1, wherein the first actuator and the second actuator are respectively microelectromechanical systems (MEMS) micro pumps.

19. The wearable display device according to claim 18, wherein the MEMS micro pump comprises:
a substrate formed with at least one inlet by etching;
an oxide layer formed and stacked on the substrate by deposition, wherein the oxide layer is formed with a plurality of convergence channels and a convergence chamber by etching, and the convergence channels are in communication between the at least one inlet of the substrate and the convergence chamber; and
a vibration layer formed and stacked on the oxide layer by deposition, wherein the vibration layer comprises:
a metal layer formed and stacked on the oxide layer by deposition, wherein the metal layer is formed with a through hole, a vibration portion, and a fixed portion by etching, the through hole is formed at a center portion of the metal layer, the vibration portion is formed on a periphery of the through hole, and the fixed portion is formed on a periphery of the metal layer;
a second oxide layer formed and stacked on the metal layer by deposition, wherein the second oxide layer is formed with an oxide layer hole by etching; and
a silicon wafer layer formed and stacked on the second oxide layer by deposition, wherein the silicon wafer layer is formed with an actuation portion, an outer peripheral portion, a plurality of connection portions, and a plurality of fluid channels by etching, wherein the actuation portion is formed at a center portion of the silicon wafer layer, the outer peripheral portion is formed on and surrounds a periphery of the actuation portion, the connection portions are respectively connected between the actuation portion and the outer peripheral portion, and the fluid channels are respectively form between the actuation portion and the outer peripheral portion and between the connection portions, and wherein a compression chamber is defined by the silicon wafer layer and the oxide layer hole of the second oxide layer; and a piezoelectric component formed and stacked on the actuation portion of the silicon wafer layer by deposition, wherein the piezoelectric component comprises a lower electrode layer, a piezoelectric layer, an insulation layer, and an upper electrode layer, wherein the piezoelectric layer is formed and stacked on the lower electrode layer by deposition, the insulation layer is formed and stacked on a portion of a surface of the piezoelectric layer and on a portion of a surface of the lower electrode layer by deposition, the upper electrode layer is formed and stacked on the insulation layer and a remaining portion of the surface of the piezoelectric layer where the insulation layer is not disposed, and the upper electrode layer is provided for electrically connecting to the piezoelectric layer;

wherein when the piezoelectric component is driven, the gas outside the MEMS micro pump is introduced into the MEMS micro pump through the at least one inlet hole of the inlet plate, converged at the convergence chamber via the at least one convergence channel, flowed through the perforation of the resonance sheet, and transmitted outwardly by a resonance effect resulting between the piezoelectric component and the actuation portion of the vibration portion.

* * * * *